(12) United States Patent
Iwata

(10) Patent No.: US 11,348,770 B2
(45) Date of Patent: *May 31, 2022

(54) SPUTTERING CATHODE, SPUTTERING CATHODE ASSEMBLY, AND SPUTTERING APPARATUS

(71) Applicant: Keihin Ramtech Co., Ltd., Kamakura (JP)

(72) Inventor: Hiroshi Iwata, Kamakura (JP)

(73) Assignee: Keihin Ramtech Co., Ltd.

(*) Notice: Subject to any disclaimer, the term of this patent is extended or adjusted under 35 U.S.C. 154(b) by 0 days.

This patent is subject to a terminal disclaimer.

(21) Appl. No.: 17/385,052

(22) Filed: Jul. 26, 2021

(65) Prior Publication Data

US 2021/0351022 A1    Nov. 11, 2021

Related U.S. Application Data

(63) Continuation of application No. 17/030,109, filed on Sep. 23, 2020, now Pat. No. 11,081,323, which is a
(Continued)

(30) Foreign Application Priority Data

| Apr. 26, 2018 | (JP) | 2018-084619 |
| May 10, 2018 | (JP) | 2018-091046 |
| May 10, 2018 | (JP) | 2018-091047 |

(51) Int. Cl.
*H01J 37/34* (2006.01)
*C23C 14/34* (2006.01)
*C23C 14/35* (2006.01)

(52) U.S. Cl.
CPC ...... *H01J 37/3417* (2013.01); *C23C 14/3407* (2013.01); *C23C 14/3464* (2013.01);
(Continued)

(58) Field of Classification Search
CPC ............ H01J 37/3417; H01J 37/3423; H01J 37/3464; H01J 37/3438; H01J 37/3441;
(Continued)

(56) References Cited

U.S. PATENT DOCUMENTS

| 5,015,493 A | 5/1991 | Gruen |
| 5,338,422 A | 8/1994 | Belkind et al. |

(Continued)

FOREIGN PATENT DOCUMENTS

| JP | H05505215 A | 8/1993 |
| JP | 2000129438 A | 5/2000 |

(Continued)

OTHER PUBLICATIONS

Decision of Refusal dated Aug. 17, 2018 for Japanese Patent Application No. 2018-091047.
(Continued)

*Primary Examiner* — Michael A Band
(74) *Attorney, Agent, or Firm* — United IP Counselors, LLC; Kenneth Fagin

(57) ABSTRACT

The sputtering cathode has a tubular shape having a pair of long sides facing each other in cross-sectional shape, has a sputtering target whose erosion surface faces inward, and a magnetic circuit is provided along the sputtering target. The pair of long sides are constituted by rotary targets each having a cylindrical shape. The rotary target is internally provided with a magnetic circuit and configured to allow the flow of cooling water. The magnetic circuit is provided parallel to the central axis of the rotary target and has a rectangular cross-sectional shape having a long side perpendicular to the radial direction of the rotary target.

5 Claims, 23 Drawing Sheets

Related U.S. Application Data continuation of application No. 16/838,321, filed on Apr. 2, 2020, now abandoned, which is a continuation of application No. 16/386,158, filed on Apr. 16, 2019, now abandoned.

(52) U.S. Cl.
CPC .......... *C23C 14/352* (2013.01); *H01J 37/342* (2013.01); *H01J 37/345* (2013.01); *H01J 37/3423* (2013.01); *H01J 37/3438* (2013.01); *H01J 37/3441* (2013.01); *H01J 37/3405* (2013.01); *H01J 37/3444* (2013.01)

(58) Field of Classification Search
CPC .... H01J 37/345; H01J 37/342; H01J 37/3444; C23C 14/352; C23C 14/3407; C23C 14/3464

See application file for complete search history.

(56) References Cited

U.S. PATENT DOCUMENTS

| | | | |
|---|---|---|---|
| 5,556,519 A | 9/1996 | Teer | |
| 6,156,170 A | 12/2000 | Akari et al. | |
| 6,267,851 B1 | 7/2001 | Hosokawa | |
| 6,488,824 B1 | 12/2002 | Hollars et al. | |
| 8,147,657 B2 | 4/2012 | Takasawa et al. | |
| 8,382,966 B2 | 2/2013 | Choi et al. | |
| 9,039,871 B2 | 5/2015 | Nauman et al. | |
| 9,303,312 B2 | 4/2016 | Wang et al. | |
| 9,631,271 B2 | 4/2017 | Choi et al. | |
| 10,580,627 B2 | 3/2020 | Iwata | |
| 10,692,708 B2 | 6/2020 | Iwata et al. | |
| 11,081,323 B2 * | 8/2021 | Iwata | H01J 37/345 |
| 2006/0278519 A1 | 12/2006 | Malaszewski et al. | |
| 2010/0078309 A1 | 4/2010 | Ueda et al. | |
| 2011/0168553 A1 | 7/2011 | Choi et al. | |
| 2013/0043128 A1 | 2/2013 | Ebe et al. | |
| 2018/0171464 A1 | 6/2018 | Iwata et al. | |

FOREIGN PATENT DOCUMENTS

| | | |
|---|---|---|
| JP | 2001081550 A | 3/2001 |
| JP | 2007031798 A | 2/2007 |
| JP | 2008184624 A | 8/2008 |
| JP | 2009299191 A | 12/2009 |
| JP | 2010265527 A | 11/2010 |
| JP | 2011140710 A | 7/2011 |
| JP | 2012052191 A | 3/2012 |
| JP | 2013049885 A | 3/2013 |
| JP | 2015193863 A | 11/2015 |
| JP | 6151401 B1 | 6/2017 |
| WO | 2007086276 A1 | 8/2007 |
| WO | 2011111712 A1 | 9/2011 |

OTHER PUBLICATIONS

Decision to Grant a Patent dated Mar. 8, 2019 for Japanese Patent Application No. 2018-091047.
Decision to Grant a Patent dated Oct. 31, 2018 for Japanese Patent Application No. 2018-091046.
International Search Report dated Jul. 16, 2019 for International Application No. PCT/JP2019/015958.
Kaokura, "Thin Film Formation by using New Facing Targets Sputtering Apparatus," J. Vac. Soc. Jpn., vol. 44, No. 9, 2001, pp. 808-814.
Notification of Reasons for Refusal dated Aug. 16, 2018 for Japanese Patent Application No. 2018-091046.
Notification of Reasons for Refusal dated Jun. 7, 2018 for Japanese Patent Application No. 2018-091046.
Notification of Reasons for Refusal dated Jun. 7, 2018 for Japanese Patent Application No. 2018-091047.
ULVAC Technical Journal, No. 64, 2006, pp. 18-22.
Yasuda et al., "Laser spectroscopy of Ar I and Ti I in plasma produced by a facing target sputtering system," Tokyo Polytechnic University Fac. of Engineering Bulletin, vol. 30 No. 1, 2007, pp. 51-58.
References Are Not Being Filed Herewith. They Are Already of Record in One or More of the Following Applications, Which Are Being Relied on for Priority Undr 35 U.S.C. Section 120 (see 37 C.F.R. Section 1.98(d)(1)): U.S. Appl. No. 17/030,109, filed Sep. 23, 2020.

* cited by examiner

FIG. 23
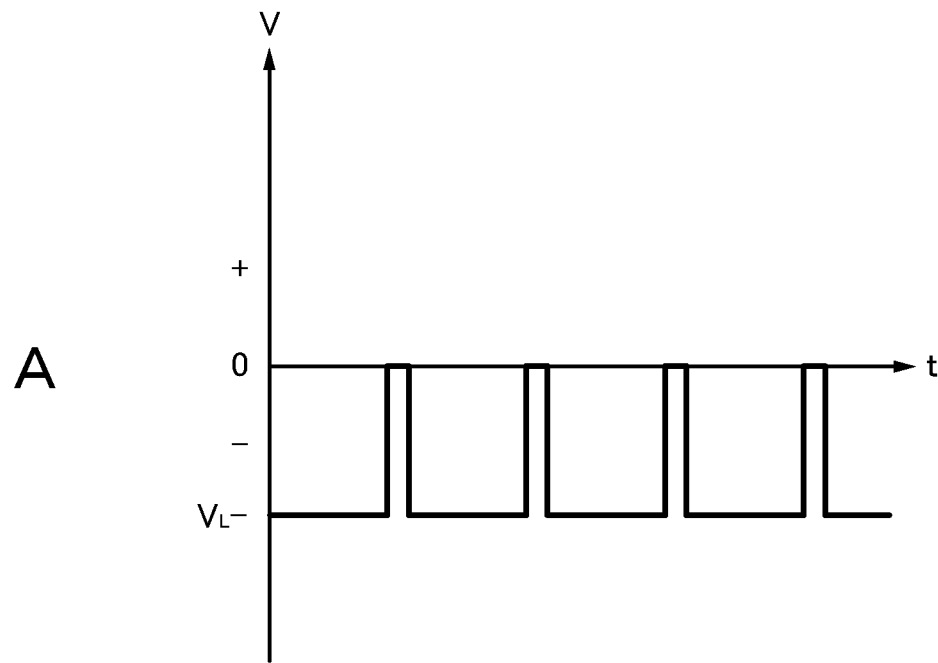
A
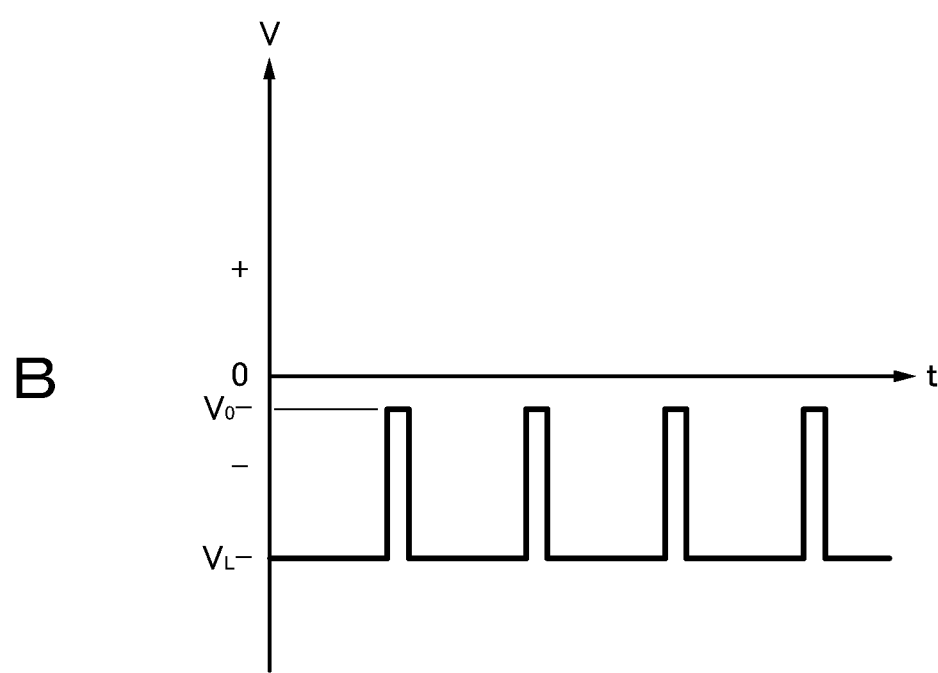
B

SPUTTERING CATHODE, SPUTTERING CATHODE ASSEMBLY, AND SPUTTERING APPARATUS

CROSS-REFERENCE TO RELATED APPLICATIONS

The present application is a continuation of U.S. application Ser. No. 17/030,109 filed Sep. 23, 2020, the priority benefit of which is claimed and the contents of which are incorporated by reference. That application is a continuation of U.S. application Ser. No. 16/838,321 filed Apr. 2, 2020, the priority benefit of which is claimed and the contents of which are incorporated by reference. That application is a continuation of U.S. application Ser. No. 16/386,158 filed Apr. 16, 2019, the priority benefit of which is claimed and the contents of which are incorporated by reference. The application claims the foreign priority benefit of Japanese patent application numbers 2018-084619 filed Apr. 26, 2018; 2018-091046 filed May 10, 2018, and 2018-091047 filed May 10, 2018, the contents of all three of which are incorporated by reference.

FIELD OF THE INVENTION

The present invention relates to a sputtering cathode, a sputtering cathode assembly and a sputtering device, and is suitable for use in the manufacture of various devices for forming thin films by way of sputtering methods.

BACKGROUND OF THE INVENTION

Conventionally, vacuum deposition devices are often used in forming films of electrode materials, in processes for forming electrodes in various devices such as semiconductor devices, solar cells, liquid crystal displays, and organic EL displays. However, because it is difficult to control the film thickness distribution, both spatially and temporally, in the vacuum deposition method, there has been a demand for electrode material film formation by way of a sputtering method.

Conventionally, parallel-plate magnetron sputtering devices, RF sputtering devices, facing-target sputtering devices, and the like have been known as sputtering devices. With facing-target sputtering devices, two equally sized circular, square, or rectangular targets made of the same material face each other, in parallel, a sputtering gas is introduced into the space therebetween, and discharge is performed, whereby film formation is performed by sputtering the targets (see, for example, Non-patent Documents 1 to 3). These facing-target sputtering devices produce a sputtering phenomenon by confining the plasma to the space that lies between two targets, which is to say, in a space surrounded by the two targets and magnetic force lines formed at the outer periphery. Sputtering cathodes of this type have an advantage in that the target is disposed perpendicular to the substrate, so that reflected neutral process-gas particles can be prevented from bombarding the surface of the film-receiving substrate.

However, the facing-target sputtering device described above has a disadvantage in that the plasma density between the two facing targets is low, such that sufficiently high film forming speeds cannot be achieved.

In order to solve these problems, the present inventor has proposed a sputtering cathode having a sputtering target, the cross-sectional shape of which is tubular, having a pair of mutually facing long-side portions, in which the erosion surfaces face inward (see Patent Document 1). With this sputtering cathode, film formation can be performed on a flat film-receiving body, at a sufficiently high film forming speed, and with low bombardment.

PRIOR ART DOCUMENTS

Patent Documents

[PATENT DOCUMENT 1] Japanese patent No. 6151401

Non-Patent Documents

[NON-PATENT DOCUMENT 1] J. Vac. Soc. Jpn. Vol. 44, No. 9, 2001, pp. 808-814
[NON-PATENT DOCUMENT 2] Academic Reports, the Faculty of Engineering, Tokyo Polytechnic University, Vol. 30 No. 1 (2007) pp. 51-58
[NON-PATENT DOCUMENT 3] ULVAC TECHNICAL JOURNAL No. 64 2006, pp. 18-22

SUMMARY OF THE INVENTION

Problems Solved by the Invention

However, the usage efficiency of the sputtering target in the sputtering cathode according to Patent Document 2 is not necessarily sufficient, and thus there is room for improvement. Meanwhile, it could not be said that the sputtering device according to Patent Document 2 was necessarily readily able to support, for example, situations in which a thin film is to be formed on a large-area substrate in a stationary state.

Here, an object of this invention is to provide a sputtering cathode with which film formation can be performed on various film-receiving bodies, including flat film-receiving bodies, at a sufficiently high film forming speed, and with low bombardment, and which moreover has high sputtering target usage efficiency, and to provide a sputtering device using this sputtering cathode.

Another object of this invention is to provide a sputtering cathode with which film formation can be performed on various film-receiving bodies, including flat film-receiving bodies, at a sufficiently high film forming speed, and with low bombardment, and which moreover can perform sputtering stably by way of preventing deposition of foreign matter such as dust, which is produced during film formation, on the sputtering target, and to provide a sputtering device using this sputtering cathode.

A further object of this invention is to provide a sputtering cathode assembly, with which film formation can be performed on a film-receiving body, without moving the film-receiving body during film formation, even when the film formation is to be performed on a film-receiving body having a large area, and to provide a sputtering device using this sputtering cathode assembly.

A further object of this invention is to provide a sputtering cathode assembly, with which film formation can be performed on various film-receiving bodies, including flat film-receiving bodies, at a sufficiently high film forming speed, and with low bombardment, and to provide a sputtering device using this sputtering cathode assembly.

The aforementioned and other objects will be apparent from the description in the present specification, referring to the accompanying drawings.

Means for Solving the Problems

In order to achieve the aforementioned objects, this invention is a sputtering cathode having a sputtering target, the cross-sectional shape of which is tubular, having a pair of mutually facing long-side portions, and having an erosion surface facing inward, a magnetic circuit being provided along the sputtering target, characterized in that the pair of long-side portions each comprises a rotary target.

Here, the rotary target has a cylindrical shape and is provided so as to be rotatable about the central axis thereof by a predetermined rotation mechanism. Typically, the rotary target is configured such that a magnetic circuit is provided at the interior and cooling water can flow at the interior. The magnetic circuit typically has a rectangular cross-sectional shape with long sides parallel to the central axes of the rotary targets and perpendicular to the radial directions of the rotary targets. In this case, in the magnetic circuit provided at the interior of one rotary target and in the magnetic circuit provided at the interior of the other rotary target, the angle of inclination of the short side of the rectangular cross-sectional shape with respect to the plane including the central axis of one rotary target and the central axis of the other rotary target is 0 or more and less than 360 degrees, and by setting the angle of inclination to any angle within this range, a good balance can be achieved between increased film forming speed and a low damage.

In this invention, with a view to ensuring a sufficient number of sputtered particles directed to the space above the sputtering target when the sputtering cathode is used mounted in a sputtering device, and with a view to preventing reflected neutral process gas particles from impacting and bombarding the film-receiving body, typically, the distance between the rotary targets constituting the pair of mutually facing long-side portions of the sputtering target is preferably 50 mm to 150 mm, more preferably 60 mm to 100 mm, and most preferably 70 mm to 90 mm. Furthermore, ratio of the length of the long-side portions to the distance between the rotary targets constituting the pair of long-side portions of the sputtering target is typically 2 or more, and preferably 5 or more. There is no particular upper limit for this ratio, but it is generally no greater than 40.

The rotary targets constituting the pair of long side portions of the sputtering target are typically mutually parallel, but there is no limitation to this, and these may be mutually inclined. The cross-sectional shape of the sputtering target is typically such that the pair of long-side portions are mutually parallel, and a pair of mutually facing short-side portions are provided, which are perpendicular to the long-side portions. In this case, the sputtering target has a rectangular tubular shape having a rectangular cross-section. The cross-sectional shape of the sputtering target may comprise, for example, a pair of mutually facing curved surface portions (for example, semicircular portions), the two ends of which project outwardly in a direction parallel to the long-side portions. A sputtering target having a rectangular tubular shape having a rectangular cross-section typically comprises a pair of rotary targets constituting a pair of long-side portions, and two flat plates forming a pair of mutually facing short-side portions perpendicular to the long-side portions. In this case, these rotary targets and flat plates are separately fabricated, and the sputtering target can be assembled by arranging these in the form of a rectangular tube. The rotary targets constituting the pair of long-side portions are generally made of a material having the same composition as that of the material with which the film is to be formed, but these may be made of mutually different materials. For example, by making a first rotary target from a material A, making a second rotary target from a material B, and causing the sputtered particle flux from the first rotary target and the sputtered particle flux from the second rotary target to be incident on the film-receiving body, a thin film comprising A and B can be formed, and by using materials with two or more components as the materials A and B, a thin film comprising a multicomponent material can be formed, as necessary. More specifically, for example, by making a first rotary target from a metal M1 comprising a single element and making a second rotary target from a metal M2 comprising a single element, a binary alloy thin film comprising M1 and M2 can be formed. This means that a film forming method similar to the binary deposition method in vacuum deposition methods can be achieved with a sputtering device. Further, for example, by inserting a removable shielding plate between the film-receiving body and a sputtering target, for example, so as to block the sputtered particle flux from the second rotary target, and moving the film-receiving body while the sputtered particle flux from the first rotary target is incident on the film-receiving body, a thin film comprising A can be first formed on the film-receiving body, and then, by shielding the sputtered particle flux from the first the rotary target and causing the sputtered particle flux from the second rotary target to be incident on the film-receiving body, while moving the film receiving body in the opposite direction, a thin film comprising B can be formed on the film receiving body. Thus, a thin film having a two-layer structure of a thin film comprising A and a thin film comprising B can be formed on the film-receiving body.

In general, the sputtered particle flux from portions other than the pair of long-side portions of the sputtering target is not actively used for film formation, but in order to prevent contamination with unintended elements, the portions other than the pair of long-side portions of the sputtering target are typically made of the same material as the long-side portions. However, if the sputtered particle flux from the portions other than the pair of long-side portions of the sputtering target are deliberately not used for film formation, the portions other than the rotary target constituting the pair of long-side portions of the sputtering target may be made of a material different from that of the rotary targets constituting the pair of long-side portions.

Since the sputtered particle flux can be extracted from the sputtering target, not only above, but also below the space surrounded by the sputtering target, as necessary, film formation may also be performed on a film formation region of another film-receiving body, while moving this film-receiving body with respect to the sputtering target at a constant speed, in a direction traversing the long-side portion of the sputtering target, below the space surrounded by the sputtering target.

Furthermore, the present invention is also a sputtering cathode having a sputtering target, the cross-sectional shape of which is tubular, having a pair of mutually facing long-side portions, and having an erosion surface facing inward, a magnetic circuit being provided along the sputtering target, characterized in that at least one of two portions of the sputtering target other than the pair of long-side portions has a shape which is curved, relative to a plane or curve including the pair of long-side portions, forming a curved surface in which the erosion surface is twisted, from one long-side portion side of the pair of long-side portions, and extending to the other long-side portion side of the pair of long-side portions.

In this invention, at least one of two portions of the sputtering target other than the pair of long-side portions is curved, relative to a plane or curve including the pair of long-side portions, forming a curved surface in which the erosion surface is twisted, from one long-side portion side of the pair of long-side portions, and extending to the other long-side portion side of the pair of long-side portions, and is, midway, oriented in the vertical direction or in the front-rear direction, so that foreign matter produced during film formation can be prevented from being deposited on the sputtering target. The pair of long-side portions may each be formed from a flat plate or may each be formed from a rotary target. Other features, unless contrary to the nature thereof, shall be deemed to have been explained in connection with the aspect of the invention described above.

Furthermore, the present invention is a sputtering cathode assembly characterized in that a plurality of sputtering cathodes having a sputtering target, the cross-sectional shape of which is tubular, having a pair of mutually facing long-side portions, and having an erosion surface facing inward, a magnetic circuit being provided along the sputtering target, are arranged in parallel.

The plurality of sputtering cathodes may be arranged in parallel, in a direction parallel to planes including the pair of long-side portions (typically in the horizontal direction), or may be arranged in parallel, in a direction perpendicular to planes including the pair of long-side portions (typically in the vertical direction), which may be selected as necessary.

Each sputtering cathode typically comprises a first flat plate and a second flat plate constituting a pair of long-side portions, and a third flat plate and a fourth flat plate constituting a pair of mutually facing short-side portions perpendicular to the long-side portions. In this case, this first flat plate, second flat plate, third flat plate and fourth flat plate are separately fabricated, and the sputtering target can be assembled by arranging these in the form of a rectangular tube. The first flat plate and the second flat plate constituting the pair of long-side portions are generally made of a material having the same composition as that of the material with which the film is to be formed, but these may be made of mutually different materials. For example, by making the first flat plate from a material A, making the second flat plate from a material B, and causing the sputtered particle flux from the first flat plate and the sputtered particle flux from the second flat plate to be incident on the film-receiving body, a thin film comprising A and B can be formed, and by using materials with two or more components as the materials A and B, a thin film comprising a multicomponent material can be formed, as necessary. More specifically, for example, by making the first flat plate from a metal M1 comprising a single element and making the second flat plate from a metal M2 comprising of a single element, a binary alloy thin film comprising M1 and M2 can be formed. Typically, the polarities of magnetic circuits of a pair of mutually adjacent sputtering cathodes are mutually the same. That is to say, if the magnetic circuit in one of the pair of mutually adjacent sputtering target surfaces is an N-pole, the corresponding portion of the other adjacent magnetic circuit is also an N-pole.

If necessary, the pair of long-side portions may each comprise rotary targets. Furthermore, if necessary, each sputtering cathode has an auxiliary magnetic pole in the vicinity of a portion of the sputtering target facing the space where the film formation is to be performed. Other features, unless contrary to the nature thereof, shall be deemed to have been explained in connection with the two aspects of the invention described above.

Furthermore, this invention is a sputtering device characterized by having:

a sputtering cathode having a sputtering target, the cross-sectional shape of which is tubular, having a pair of mutually facing long-side portions, and having an erosion surface facing inward, a magnetic circuit being provided along the sputtering target, wherein the pair of long-side portions each comprise a cylindrical rotary target, and an anode provided so as to expose the erosion surface of the sputtering target.

Furthermore, this invention is a sputtering device characterized by having a sputtering cathode having a sputtering target, the cross-sectional shape of which is tubular, having a pair of mutually facing long-side portions, and having an erosion surface facing inward, a magnetic circuit being provided along the sputtering target, wherein at least one of two portions of the sputtering target other than the pair of long-side portions has a shape which is curved, relative to a plane or curve including the pair of long-side portions, forming a curved surface in which the erosion surface is twisted, from one long-side portion side of the pair of long-side portions, and extending to the other long-side portion side of the pair of long-side portions, and an anode provided so as to expose the erosion surface of the sputtering target.

Furthermore, this invention is a sputtering device characterized by having:

a sputtering cathode assembly in which a plurality of sputtering cathodes having a sputtering target, the cross-sectional shape of which is tubular, having a pair of mutually facing long-side portions, and having an erosion surface facing inward, a magnetic circuit being provided along the sputtering target, are arranged in parallel, and anodes provided so as to expose the erosion surface of each of the sputtering targets.

Here, an AC power source is typically connected between two mutually adjacent sputtering cathodes among the plurality of sputtering cathodes arranged in parallel, and an AC voltage is applied thereto. Thus, two mutually adjacent sputtering cathodes can alternately repeat between negative electrode and positive electrode, whereby sputtering can be alternately performed, and an anode loss phenomenon, which is caused by the deposition of an insulating film on the anode, can be avoided, thereby achieving reactive sputtering film formation having long-term stability, with low damage.

With each of the sputtering devices described above, film formation can be performed in a film formation region on the film-receiving body by sputtering the inner surfaces of the long-side portions of the sputtering targets with ions in plasma generated from sputtering gas, by performing discharge so as to generate a plasma that circulates along the inner surfaces of the sputtering targets, while moving a film receiving body having a film formation region with a width that is narrower than the long-side portions of the sputtering target, relative to the sputtering target, above a space surrounded by the sputtering target, at a constant speed, in a direction that traverses the long sides of the sputtering targets, or with this in a stationary state above the space surrounded by the sputtering target. In the invention for the sputtering devices described above, other features, unless contrary to the nature thereof, shall be deemed to have been explained in connection with the aspects of the invention for the sputtering cathode described above.

Furthermore, in the invention for the sputtering cathode, the sputtering cathode assembly, and the sputtering device described above, in order to prevent positive ions generated from the sputtering gas from bombarding the film-receiving body during film formation and thereby causing damage to the film-receiving body and the thin film formed on the film-receiving body, preferably, the voltage applied between the sputtering cathode and the anode is a pulse waveform, and the high level of the voltage pulse at the sputtering cathode is 0 V, or a negative voltage $V_0-$, the absolute value of which is about 50 V or less, and the low level is a negative voltage $V_L-$, the absolute value of which is about 100 V or more, whereby a positive voltage is not applied.

Effects of the Invention

According to this invention, the sputtering target of the sputtering cathode has a cross-sectional shape which is tubular, having a pair of mutually facing long-side portions, which is to say, a shape surrounded by four sides, and the erosion surface faces inward, whereby, when the sputtering cathode is mounted in the sputtering device and discharge is performed, plasma which circulates at the inner surface of the sputtering target can be generated at the erosion surface side of the sputtering target. Therefore, the film forming speed can be sufficiently increased by increasing the plasma density. Furthermore, since the location in which the majority of the plasma is generated is limited to the vicinity of the surface of the sputtering target, it is possible to minimize the risk of damage occurring due to irradiation of the film-receiving body by light emitted from the plasma. Furthermore, in particular, if the pair of long-side portions each comprise a rotary target, sputtering can be performed while rotating the rotary targets, and therefore the usage efficiency of the sputtering targets is high. Furthermore, in particular, by causing at least one of two portions of the sputtering target other than the pair of long-side portions to have a shape which is curved, relative to a plane or curve including the pair of long-side portions, forming a curved surface in which the erosion surface is twisted, from one long-side portion side of the pair of long-side portions, and extending to the other long-side portion side of the pair of long-side portions, foreign matter produced during film formation can be prevented from being deposited on that portion of the sputtering target, thus allowing sputtering to be performed stably. Furthermore, in particular, with a sputtering cathode assembly in which a plurality of sputtering cathodes are arranged in parallel, film formation can be performed even with a film-receiving body having a large area such as covers the assembly of these sputtering cathodes, and when arranged in parallel, in a direction perpendicular to a plane including the pair of long-side portions, and typically the vertical direction, film formation can be performed which simultaneously uses sputtering particles from a plurality of sputtering targets, whereby the film forming speed can be greatly increased.

BRIEF DESCRIPTION OF THE DRAWINGS

FIG. 23 This is a schematic drawings showing voltage pulse waveforms for a pulse power supply in a sputtering device according to an eighth embodiment of this invention.

MODE FOR CARRYING OUT THE INVENTION

Hereafter, modes for carrying out the invention (hereinafter referred to as "embodiments") will be described with reference to the drawings.

First Embodiment

[Sputtering Device]

Figure 1:
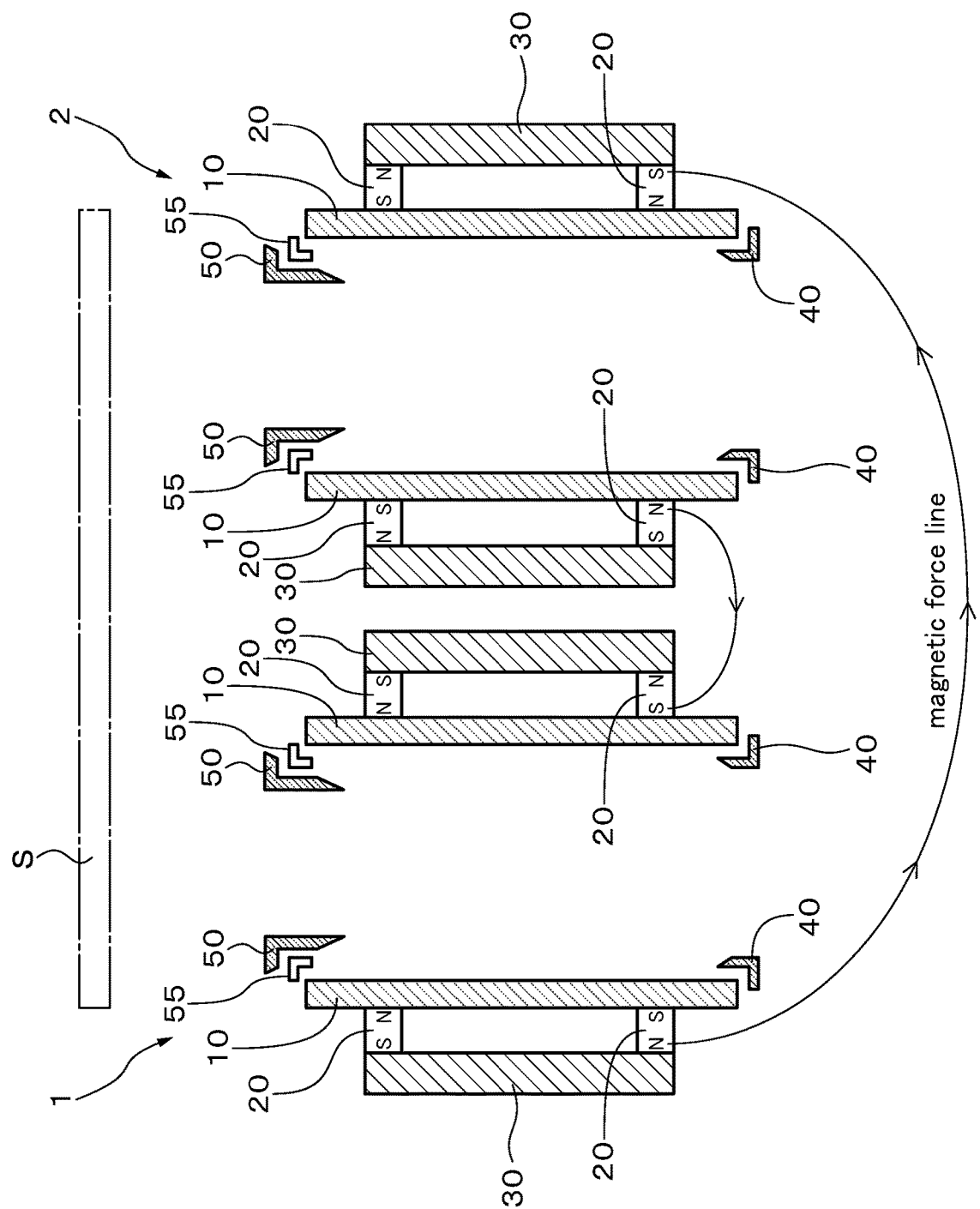
FIG. 1 This is a longitudinal sectional view showing a sputtering device according to a first embodiment of this invention.
Figure 2:
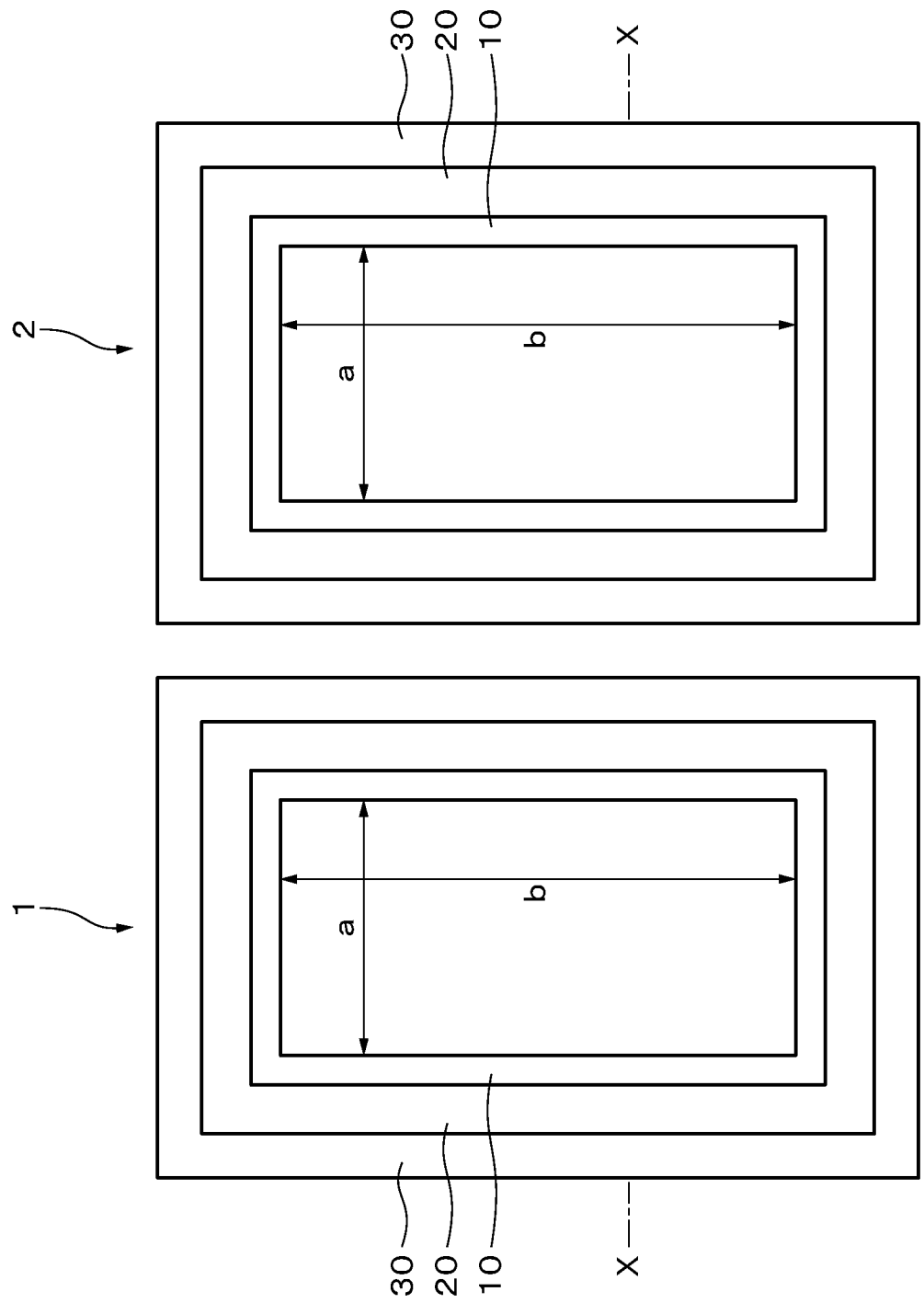
FIG. 2 This is a plan view showing a sputtering cathode assembly in the sputtering device according to the first embodiment of this invention.

FIGS. 1 and 2 are a longitudinal cross-sectional view and a plan view showing a sputtering device according to the first embodiment, which show the configuration in the vicinity of a sputtering cathode assembly provided inside a vacuum vessel of the sputtering device. FIG. 1 is a cross-sectional view along the line X-X in FIG. 2.

As shown in FIG. 1 and FIG. 2, in this sputtering device, a plurality of sputtering cathodes are arranged in parallel on a horizontal plane, and a sputtering cathode assembly is formed by these sputtering cathodes. The number of sputtering cathodes constituting the sputtering cathode assembly is selected as appropriate, in accordance with the size of the substrate on which the film is to be formed, the method with which the film is to be formed, and the like. In FIG. 1 and FIG. 2, only one mutually adjacent pair of sputtering cathodes 1 and 2 is shown, by way of example, but the there is no limitation to this. The spacing between the sputtering cathodes 1 and 2 is selected as appropriate, in accordance with the size of the substrate on which the film is to be formed and the method with which the film is to be formed. If three or more sputtering cathodes constitute the sputtering cathode assembly, the spacing between the sputtering cathodes is generally equal, but this does not necessarily have to be equal, and in such cases, the spacing is selected as required.

The sputtering cathode 1 has: a sputtering target 10 having a rectangular tubular shape having a rectangular cross-section and erosion surfaces facing inward, permanent magnets 20 provided outside the sputtering target 10, and a yoke 30 provided outside the permanent magnets 20. The sputtering target 10, the permanent magnets 20, and the yoke 30 form the sputtering cathode 1. The sputtering cathode 1 is generally fixed to the vacuum vessel in an electrically insulated manner. A magnetic circuit is formed by the permanent magnets 20 and the yoke 30. The polarities of the permanent magnets 20 are as shown in FIG. 1, but the polarities may also be respectively the exact opposites. A cooling backing plate is preferably provided between the sputtering target 10 and the permanent magnets 20, and cooling water, for example, flows in a flow path provided inside the backing plate. An anode 40 having an L-shaped cross-section is provided in the vicinity of the lower end of a rectangular parallelepiped space surrounded by the sputtering target 10 so that the erosion surface of the sputtering target 10 is exposed. This anode 40 is generally connected to the grounded vacuum vessel. Furthermore, a light blocking shield 50 having an L-shaped cross-section is provided in the vicinity of the upper end of the rectangular parallelepiped space surrounded by the sputtering target 10 so that the erosion surface of the sputtering target 10 is exposed. The light blocking shield 50 is formed from a conductor, and typically from a metal. The light blocking shield 50 also serves as an anode and is generally connected to the grounded vacuum vessel, in the same manner as the anode 40. An auxiliary magnetic pole 55 having an L-shaped cross section is provided between the light blocking shield 50 and the sputtering target 10, so as to expose the erosion surface of the sputtering target 10. The auxiliary magnetic pole 55 serves to prevent magnetic force lines formed by the magnetic circuit, which is formed by the permanent magnets 20 and the yoke 30, from leaking into the space above the sputtering cathode 1, where the film formation is to be performed, and the arrangement of this magnetic pole is selected so as to cancel out magnetic force lines that leak above the sputtering cathode 1.

The sputtering cathode 2 is the same as the sputtering cathode 1 except that the polarities of the permanent magnets 20 are opposite to the polarities of the permanent magnets 20 of the sputtering cathode 1 as shown in FIG. 1. The same is true in cases where there are other sputtering cathodes, with a pair of mutually adjacent sputtering cathodes being mutually identical, except that the permanent magnets 20 have mutually opposite polarities, and having a mutually identical orientation. Since the polarities of the permanent magnets 20 in the pair of mutually adjacent sputtering cathodes are thus mutually opposite, due to the magnetic force lines formed by the magnetic circuits, which are formed by the permanent magnets 20 and the yokes 30, when a pair of AC sputtering powers are applied to both sputtering cathodes, as shown in FIG. 1, plasma moving to the adjacent electrode is confined to the space below the sputtering cathode assembly, and plasma leakage to the space in which the film formation above the sputtering cathode assembly is performed can be effectively prevented. Further, a separate auxiliary magnetic pole may be used in the lower space to make the plasma movement to the adjacent sputtering cathode more effective.

As shown in FIG. 2, where a is the distance between a pair of mutually facing long-side portions of the sputtering target 10 of each sputtering cathode constituting the sputtering cathode assembly, and b is the distance between a pair of mutually facing short-side portions of the sputtering target 10, b/a is selected to be 2 or more, and is generally selected to be 40 or less, but is not limited thereto. a is generally selected from 50 mm to 150 mm, but is not limited to this thereto.

As shown in FIG. 1, in this sputtering device, film formation is performed on a substrate S (film-receiving body), which is held by a non-illustrated predetermined transport mechanism, in a space above the sputtering cathode assembly. The film formation may be performed while the substrate S is being moved with respect to the sputtering targets 10 of the sputtering cathodes, in a direction traversing the long-side portions of the sputtering targets 10, typically in a direction parallel to the upper end faces of the sputtering targets 10 and perpendicular to the long-side portions of the sputtering targets 10, and typically at a constant speed, or may be performed in a stationary state with the substrate S stationary above the sputtering cathode assembly. The width of the film formation region on the substrate S, in the direction parallel to the long-side portion of the sputtering target 10, is selected to be less than b so that, during film formation, this lies between the pair of mutually facing short-side portions on the inside of the sputtering target 10. If the film formation is to be performed on the entire surface of the substrate S, the width of the film formation region of the substrate S coincides with the width of the substrate S. The substrate S may basically be of any kind, and is not particularly limited. The substrate S may be in the form of a long film, wound on a roll, as used in so-called roll-to-roll processes.

[Film Forming Method Using the Sputtering Device]

Before film formation, the substrate S is located at a position sufficiently far from the top of the space surrounded by the sputtering target 10.

Figure 3:
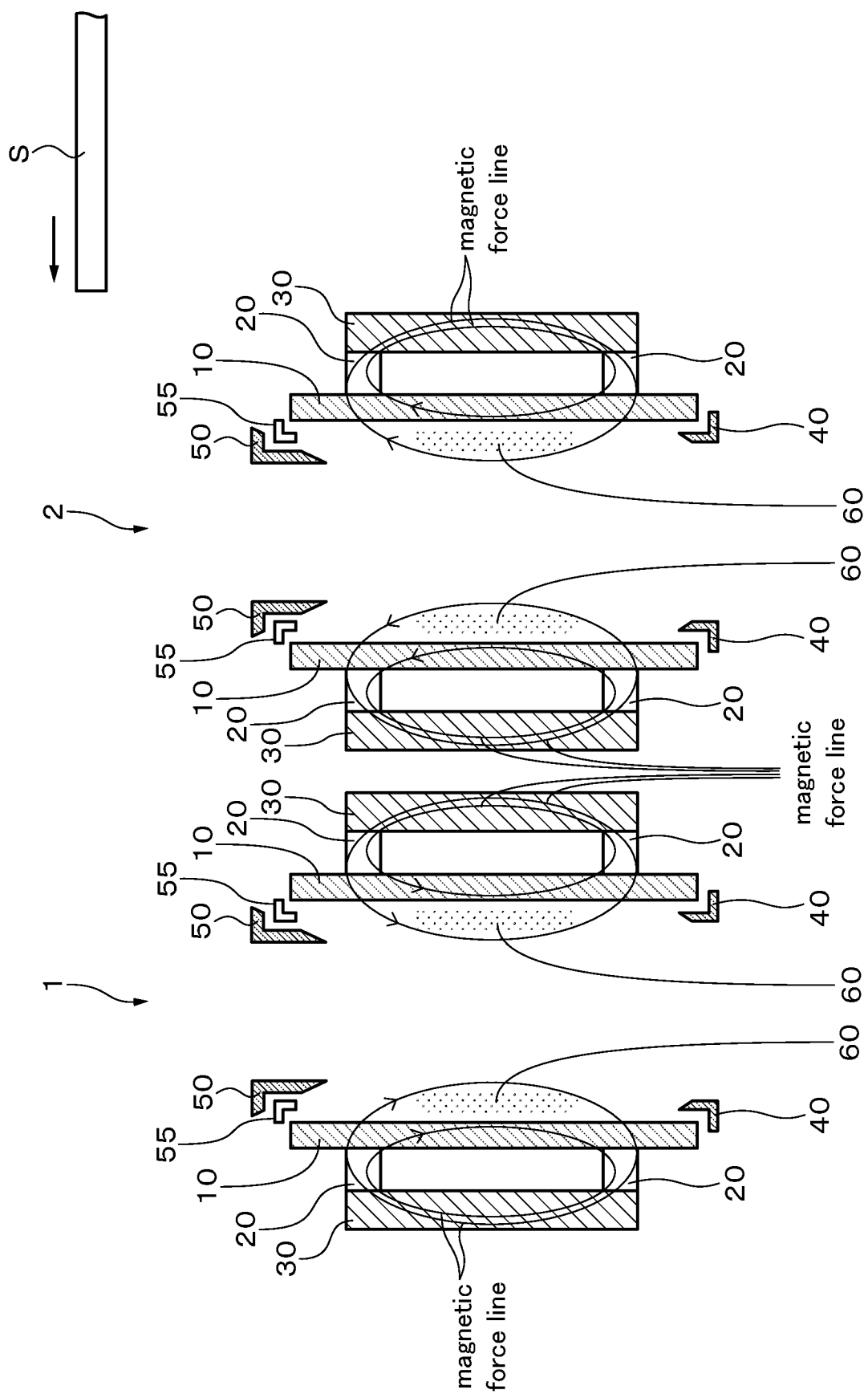
FIG. 3 This is a longitudinal sectional view showing the manner in which plasma is generated near the surface of each sputtering target in the sputtering device according to the first embodiment of this invention.
Figure 4:
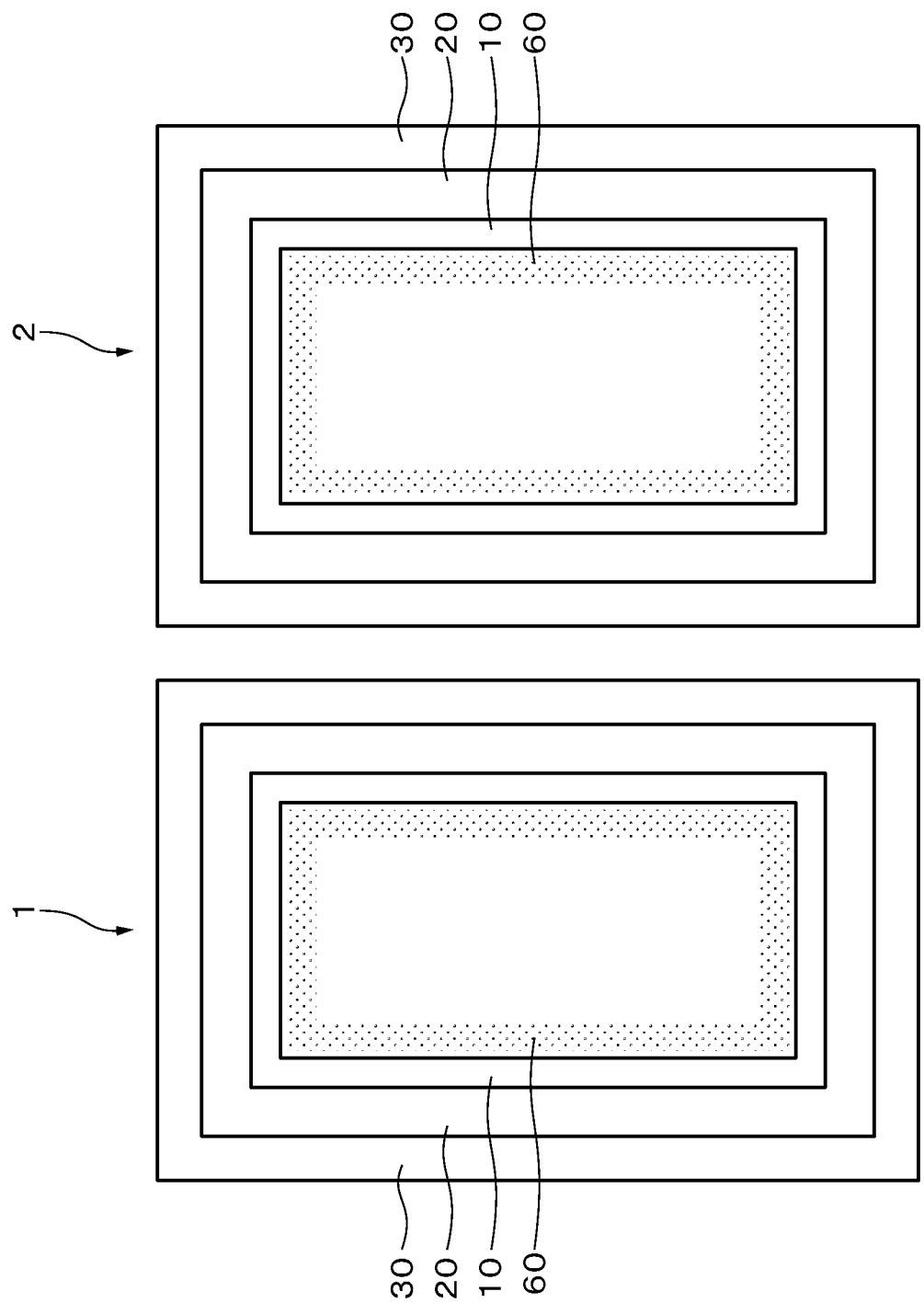
FIG. 4 This is a plan view showing the manner in which plasma is generated near the surface of each sputtering target in the sputtering device according to the first embodiment of this invention.
Figure 5:
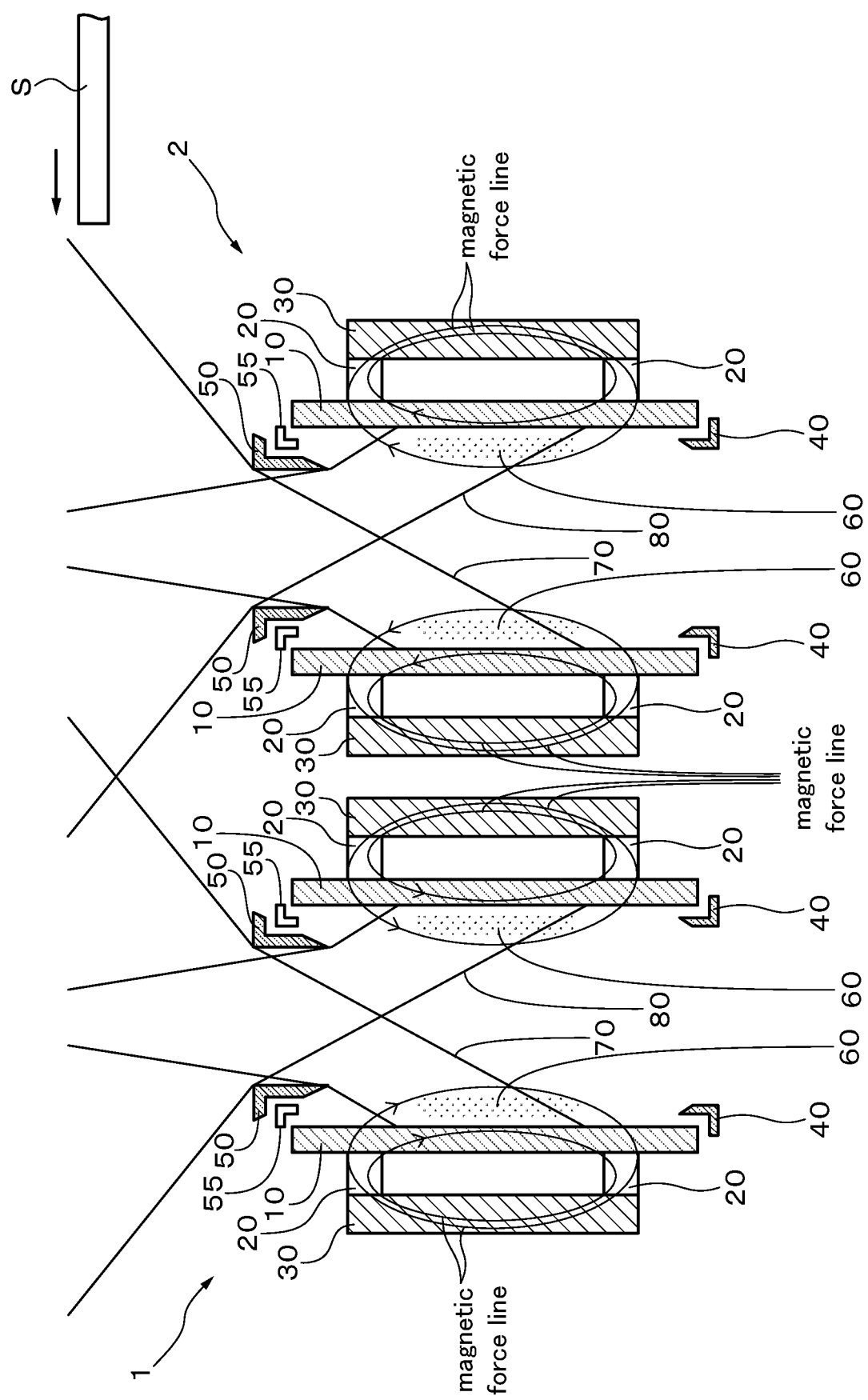
FIG. 5 This is a longitudinal sectional view showing a method of forming a thin film on a substrate with the sputtering device according to the first embodiment of this invention.

After the vacuum vessel is evacuated to a high vacuum by a vacuum pump, Ar gas is introduced, as a sputtering gas, into the space surrounded by the sputtering target 10, and an AC voltage necessary for plasma generation is applied between the anodes 40 and the sputtering cathodes 1 and 2, from a predetermined power supply. Typically, the anodes 40 are grounded, and a high AC voltage (for example, −400 V) is applied between the sputtering cathode 1 and the sputtering cathode 2. Thus, while a negative high voltage is applied to the sputtering cathode 1, a plasma 60 is generated in the vicinity of the surface of the sputtering target 10, which circulates along the inner surface of the sputtering target 10, as shown in FIGS. 3 and 4. The plasma 60 is not generated while a negative high voltage is not applied to the sputtering cathode 1. Furthermore, while a negative high voltage is applied to the sputtering cathode 2, a plasma 60 is generated in the vicinity of the surface of the sputtering target 10 of the sputtering cathode 2, which circulates along the inner surface of the sputtering target 10 of the sputtering cathode 2. The plasma 60 is not generated while a negative high voltage is not applied to the sputtering cathode 2. As shown in FIG. 3 and FIG. 4, as a result of sputtering the sputtering target 10 with Ar ions in the plasma 60 circulating along the inner surface of the sputtering target 10, atoms comprised by the sputtering target 10 are ejected upward from the space surrounded by the sputtering target 10. At this time, atoms are ejected from all parts of the erosion surface of the sputtering target 10 near the plasma 60, but atoms that are ejected from the erosion surface of the short side portion of the inside of the sputtering target 10 are essentially not used for film formation. Therefore, horizontal shielding plates may be provided above the sputtering target 10 so as to shield both end portions, in the long side direction, of the sputtering target 10, so that atoms ejected from the erosion surfaces of the short-side portions of the sputtering target 10 do not reach the substrate S during film formation. Alternatively, the width b of the sputtering target 10 in the longitudinal direction may be made sufficiently greater than the width of the substrate S, so that atoms ejected from the erosion surfaces on the short-side portions of the sputtering target 10 do not reach the substrate S during film formation. As shown in FIG. 5, as a result of some of the atoms ejected from the sputtering target 10 being shielded by the light blocking shield 50, sputtered particle fluxes 70, 80 are produced from the erosion surfaces of the long-side portions of the sputtering target 10. The sputtered particle fluxes 70, 80 have substantially uniform intensity distributions in the longitudinal direction of the sputtering target 10. Meanwhile, while a negative high voltage is applied to the sputtering cathode 2, a plasma 60 is generated in the vicinity of the surface of the sputtering target 10, which circulates along the inner surface of the sputtering target 10, as shown in FIGS. 3 and 4, and as a result, sputtering is performed by the sputtered particle fluxes 70, 80. The plasma 60 is not generated while a negative high voltage is not applied to the sputtering cathode 1, and sputtering does not occur. That is to say, as can be understood from the foregoing description, the sputtering cathode 1 and the sputtering cathode 2 are used alternately.

First, a case in which film formation is performed while moving the substrate S will be described.

Figure 6:
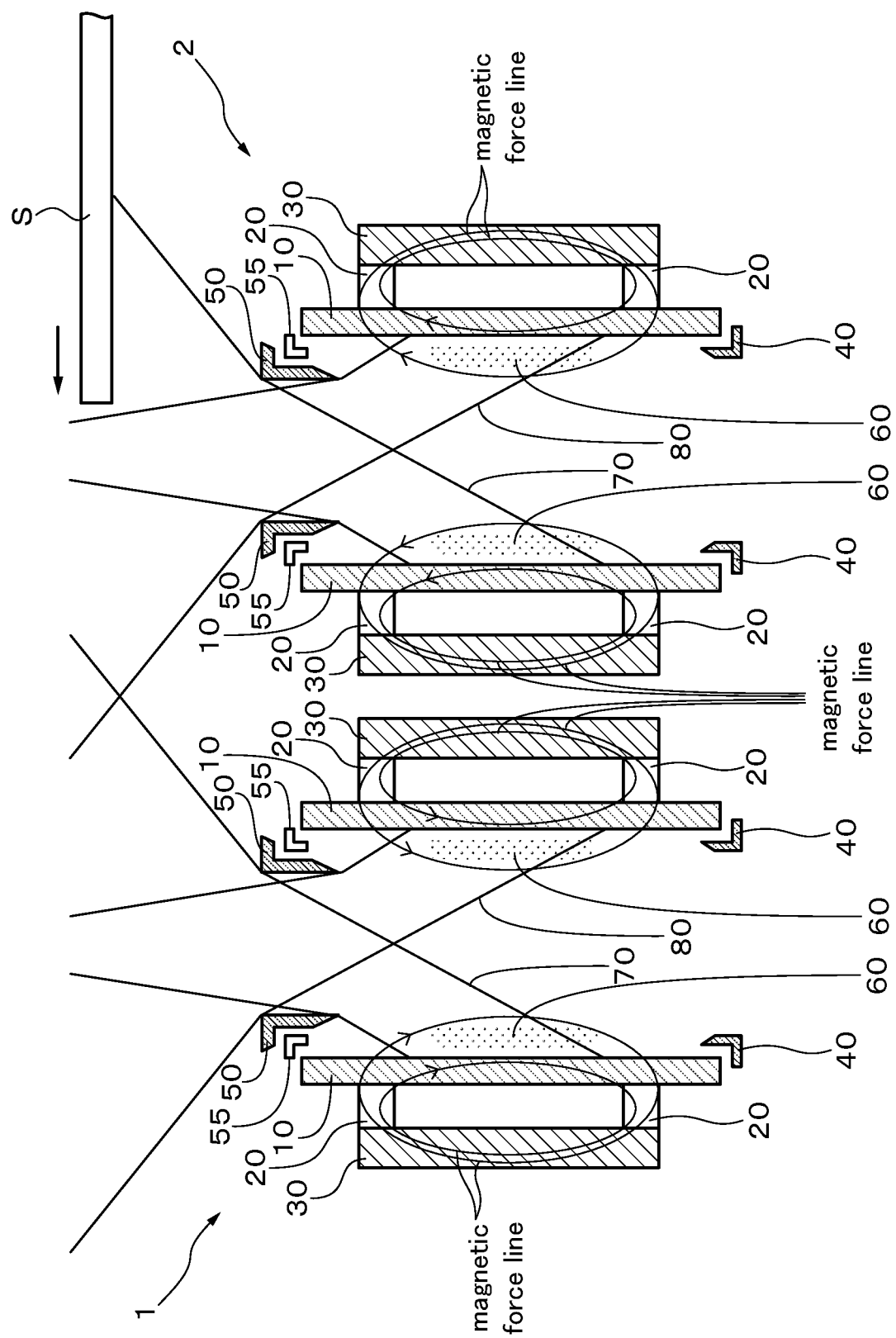
FIG. 6 This is a longitudinal sectional view showing a method of forming a thin film on a substrate with the sputtering device according to the first embodiment of this invention.
Figure 7:
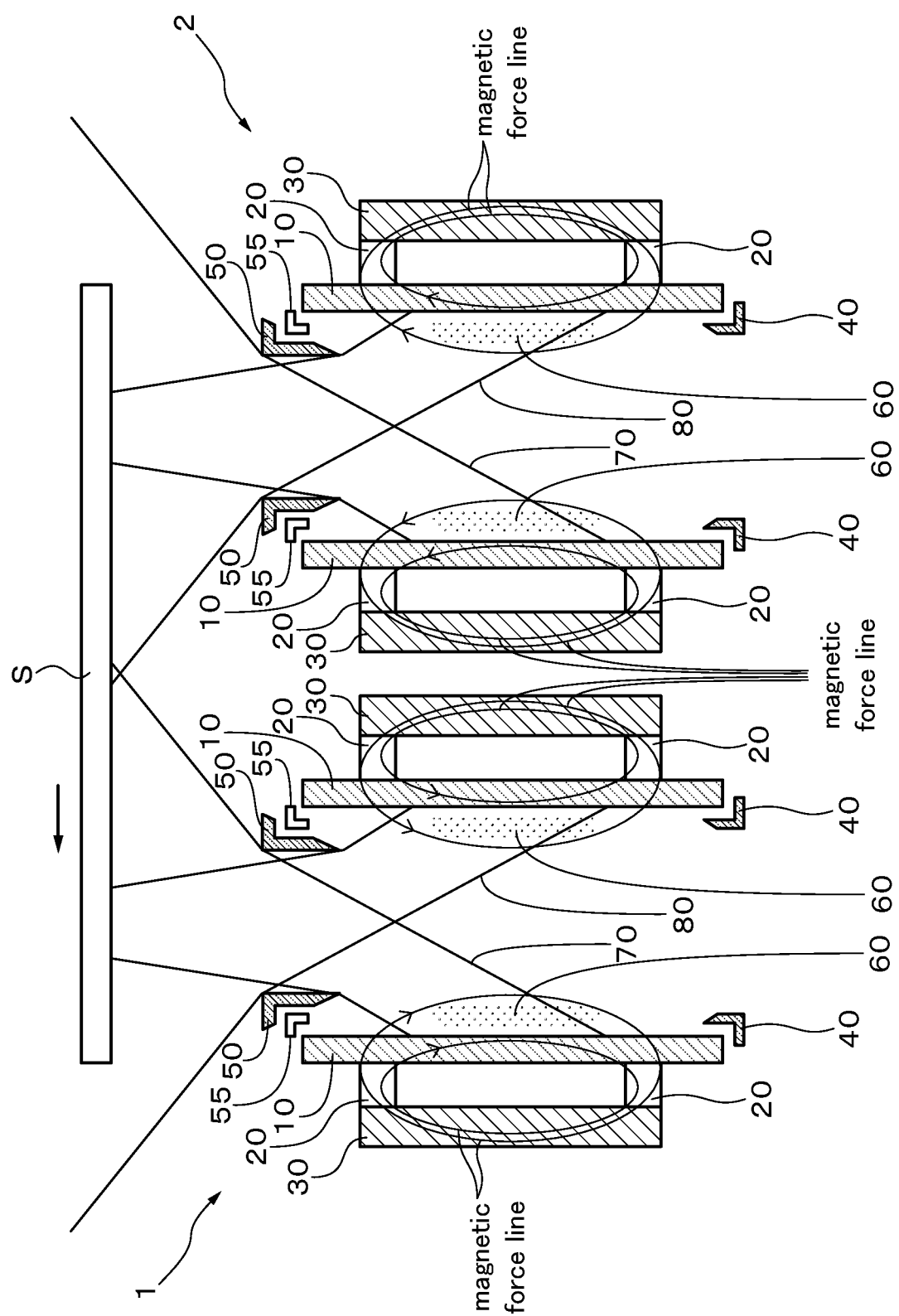
FIG. 7 This is a longitudinal sectional view showing a method of forming a thin film on a substrate with the sputtering device according to the first embodiment of this invention.
Figure 8:
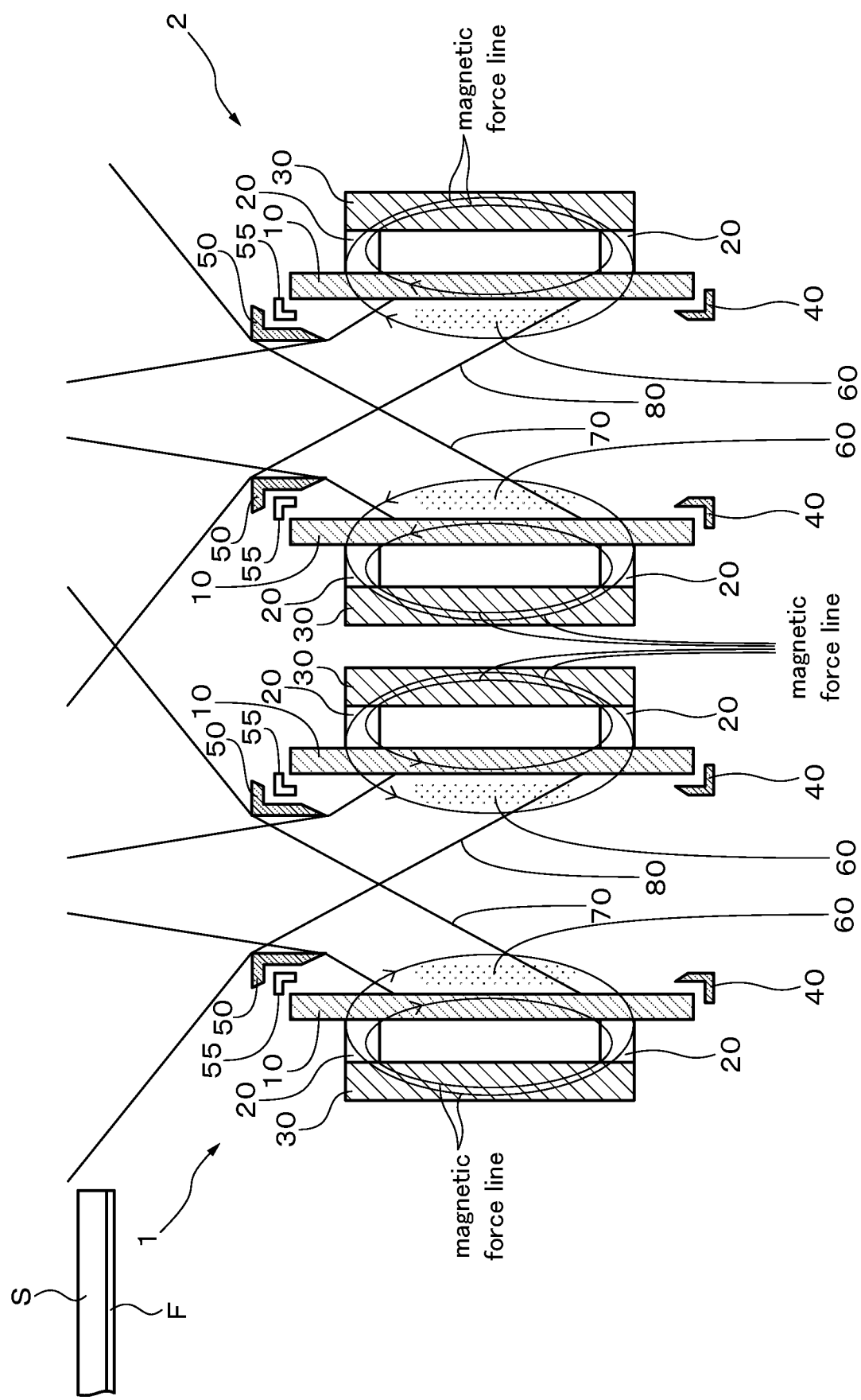
FIG. 8 This is a longitudinal sectional view showing a method of forming a thin film on a substrate with the sputtering device according to the first embodiment of this invention.

When stable sputtered particle fluxes 70, 80 from the sputtering targets 10 of the sputtering cathodes 1, 2 have been produced, film formation is performed with the sputtering particle fluxes 70, 80, while moving the substrate S with respect to the sputtering target 10 of the sputtering cathode 1 at a constant speed, in the direction traversing the long-side portions of the sputtering target 10. When the substrate S moves above the space surrounded by the sputtering target 10, first, the sputtered particle flux 70 is incident on the substrate S, and film formation begins. FIG. 6 shows the situation at the point in time when the leading edge of the substrate S has approached above the vicinity of the center of the space surrounded by the sputtering target 10. At this point in time, the sputtered particle flux 80 does not contribute to film formation. When the substrate S moves further, and the sputtered particle flux 80 is incident thereon, the sputtered particle flux 80 also contributes to film formation, in addition to the sputtered particle flux 70. When the substrate S moves further and reaches the sputtering cathode 2, film formation is similarly carried out by the sputtered particle fluxes 80 and 70 produced with the sputtering target 10 of the sputtering cathode 2. FIG. 7 shows the situation in which the substrate S has moved further so as to have moved directly above the sputtering cathode assembly. As shown in FIG. 7, the sputtered particle fluxes 70, 80 produced with the sputtering targets 10 of the sputtering cathodes 1 and 2 are incident on the substrate S, whereby film formation is performed. The substrate S is moved in this manner while film formation is performed. Then, as shown in FIG. 8, the substrate S is fully distanced from above the sputtering cathode assembly, moving to a position at which the sputtered particle fluxes 70 and 80 are not incident on the substrate S. A thin film F is formed on the substrate S in this manner.

Next, a case in which film formation is performed without moving the substrate S, which is to say, a case in which static film formation is performed, will be described.

Figure 9:
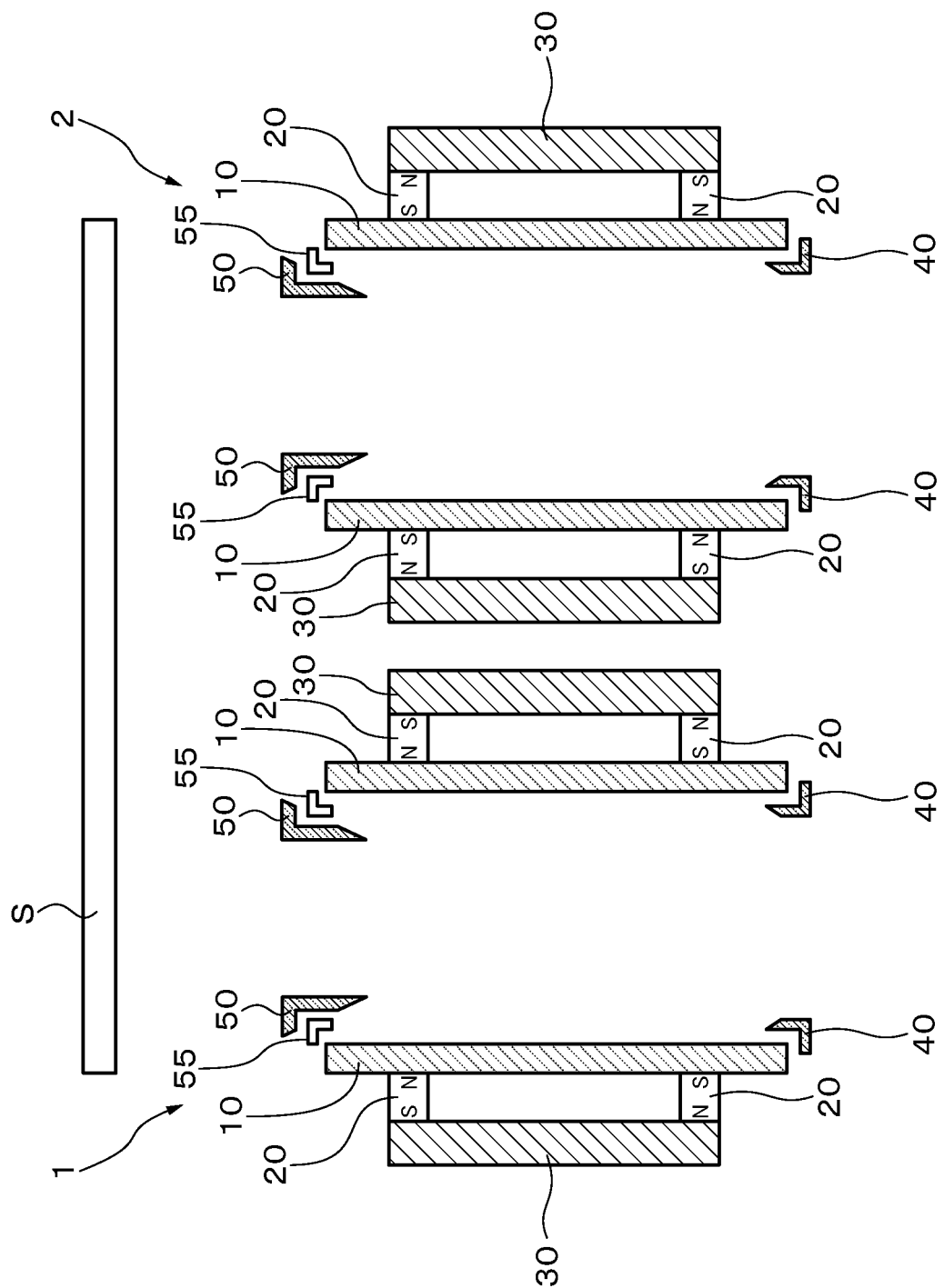
FIG. 9 This is a longitudinal sectional view showing a method of forming a thin film on a substrate with the sputtering device according to the first embodiment of this invention.

In this case, it is assumed that the substrate S has a size that covers a plurality of sputtering cathodes, as shown in FIG. 9. A shutter (not shown) for preventing the sputtered particle fluxes 70, 80 from being incident on the substrate S can be inserted in the space between the substrate S and the sputtering cathodes. At a point in time at which, with the shutter inserted into the space between the substrate S and the sputtering cathodes, stable sputtered particle fluxes 70 and 80 are produced from the sputtering cathodes, the shutter is moved out of the space between the substrate S and the sputtering cathodes. At this point in time, the sputtered particle fluxes 80 and 70 are incident on the substrate S, and film formation begins. By performing sputtering in this manner for the required time, a thin film F is formed on the substrate S by way of static film formation. Here, the distance between the opposed target surfaces, the distance between the end of target and the substrate, and the spacing between adjacent cathodes are set to optimum values.

[Example of the Sputtering Cathode and Anode in the Sputtering Device]

Figure 10:
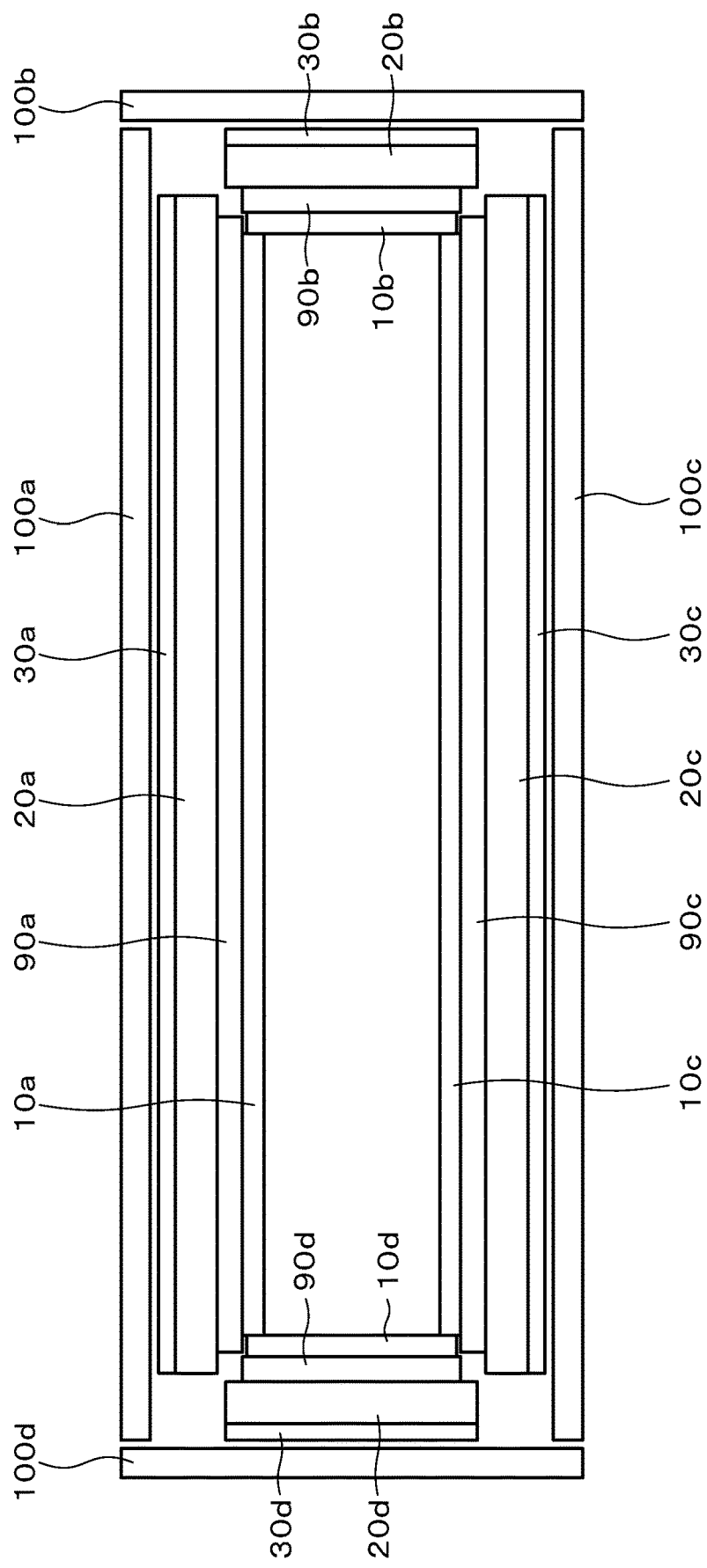
FIG. 10 This is a plan view showing the structure of a sputtering cathode and an anode as an example of the sputtering device according to the first embodiment of this invention.

As shown in FIG. 10, the sputtering target 10 is formed from four plate-shaped sputtering targets 10a, 10b, 10c, and 10d, the permanent magnet 20 is formed from four plate-shaped or rod-shaped permanent magnets 20a, 20b, 20c, and 20d, and the yoke 30 is formed from four plate-shaped yokes 30a, 30b, 30c, and 30d. Backing plates 90a, 90b, 90c, and 90d are respectively inserted between the sputtering targets 10a, 10b, 10c, and 10d and the permanent magnets 20a, 20b, 20c, and 20d. The distance between the sputtering target 10a and the sputtering target 10c is 80 mm, the distance between the sputtering target 10b and the sputtering target 10d is 200 mm, and the height of the sputtering targets 10a, 10b, 10c, and 10d is 80 mm.

Four plate-shaped anodes 100a, 100b, 100c, and 100d are provided outside of the yokes 30a, 30b, 30c, and 30d. The anodes 100a, 100b, 100c, and 100d are connected to a grounded vacuum vessel, together with an anode 40.

As described above, according to the first embodiment, a plurality of sputtering cathodes having the sputtering target 10 with a rectangular tubular shape having a rectangular cross-section, and having erosion surfaces facing inward, are arranged in parallel on a horizontal plane, and the polarities of the permanent magnets 20 of two mutually adjacent sputtering cathodes are mutually opposite, whereby the following various advantages can be obtained. That is to say, because sputtering can be performed using a plurality of sputtering cathodes 1 arranged in parallel, the thin film F can be formed on a substrate S having a large area, at a high speed. Furthermore, the plasma 60 can be generated circulating around the inner surface of the sputtering target 10 on the erosion surface side of the sputtering target 10. Therefore, since the density of the plasma 60 can be increased, the film forming speed can be sufficiently increased. Further, since the location at which the majority of the plasma 60 is generated is limited to the vicinity of the surface of the sputtering target 10, in combination with the provision of the light blocking shield 50, the possibility of damage occurring due to the irradiation of the substrate S with light emitted from the plasma 60 can be minimized. Furthermore, the magnetic force lines generated by the magnetic circuit, which is formed by the permanent magnets 20 and the yoke 30, are basically restricted to the sputtering cathode, and moreover, the polarities of the permanent magnets 20 of the two mutually adjacent sputtering cathodes are mutually opposite, and the auxiliary magnetic pole 55 is provided, whereby, among the magnetic force lines generated by the magnetic circuit, the downwardly oriented magnetic force lines are confined in the space below the sputtering cathode assembly, and are not oriented toward the substrate S, as shown in FIG. 1, and there is no risk of the substrate S being damaged by the plasma 60 or electron rays. Furthermore, since the film formation is carried out using the sputtered particle fluxes 70, 80 produced with the pair of mutually facing long-side portions of the sputtering target 10, damage due to bombardment of the substrate S by reflected high energy particles of the neutral sputtering gas can be minimized. Further, because the sputtered particle fluxes 70, 80 produced with the pair of mutually facing long-side portions of the sputtering target 10 have a uniform intensity distribution in a direction parallel to the long-side portions, in combination with performing film formation while moving the substrate S at a constant speed in a direction traversing these long-side portions, for example, in a direction perpendicular to these long-side portions, variations in the film thickness of the thin film F formed on the substrate S can be reduced and, for example, variations in the film thickness can be reduced to ±5% or less. The sputtering device is preferably used in film formation for electrode materials or the like, in the manufacture of various devices such as semiconductor devices, organic solar cells, inorganic solar cells, liquid crystal displays, organic EL displays, films and the like.

Second Embodiment

[Sputtering Device]

Figure 11:
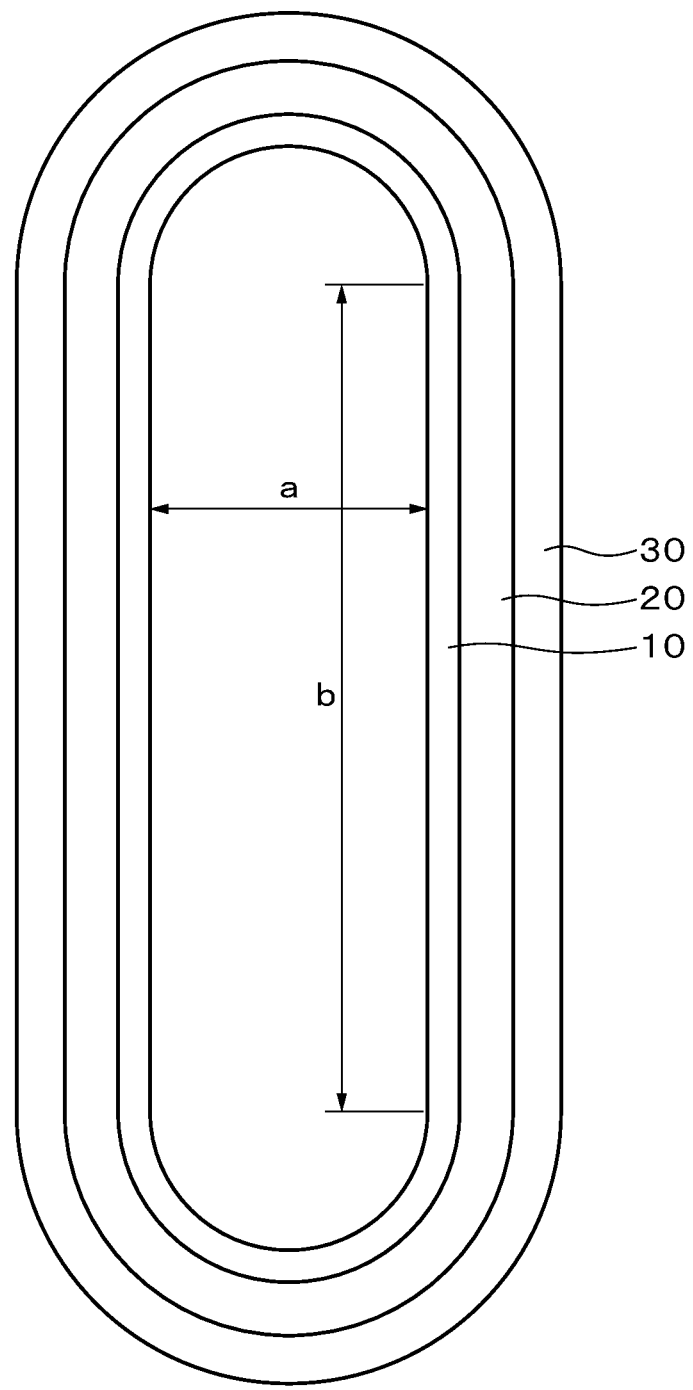
FIG. 11 This is a plan view showing a sputtering cathode constituting a sputtering cathode assembly in a sputtering device according to a second embodiment of this invention.

The sputtering device according to the second embodiment differs from the sputtering device according to the first embodiment in that the sputtering target 10 shown in FIG. 11 is used. That is to say, as shown in FIG. 11, the sputtering target 10 includes a pair of parallel mutually facing long-side portions and semicircular portions connected to the long-side portions. The permanent magnet 20 provided outside the sputtering target 10 and the yoke 30 provided outside the permanent magnet 20 have the same shape as the sputtering target 10. The configuration of the sputtering device is otherwise the same as that of the sputtering device according to the first embodiment.

[Film Forming Method Using the Sputtering Device]

The film forming method using this sputtering device is the same as that of the first embodiment.

Advantages similar to those of the first embodiment can be obtained with the second embodiment.

Third Embodiment

[Sputtering Device]

Figure 12:
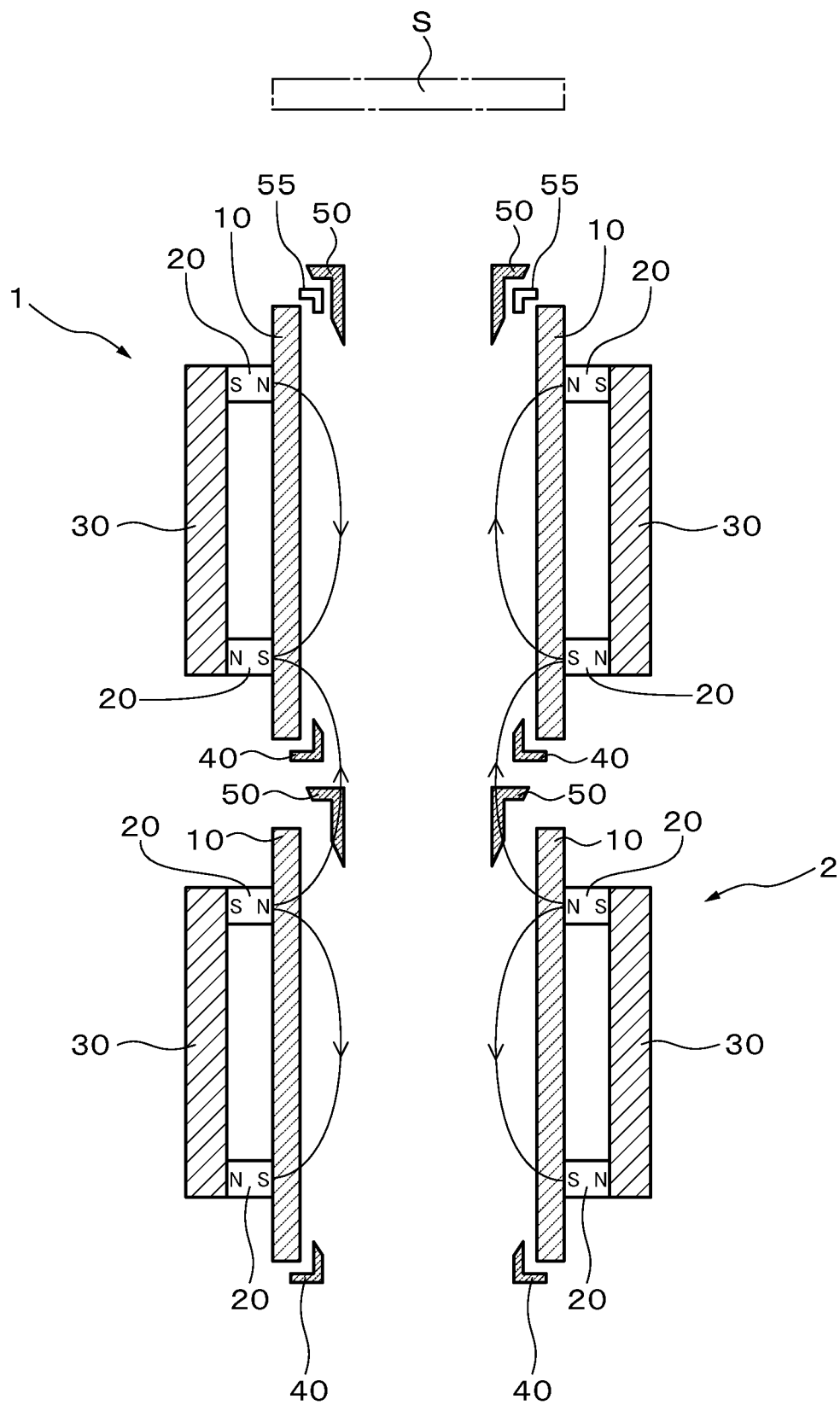
FIG. 12 This is a longitudinal sectional view showing a sputtering device according to a third embodiment of this invention.
Figure 13:
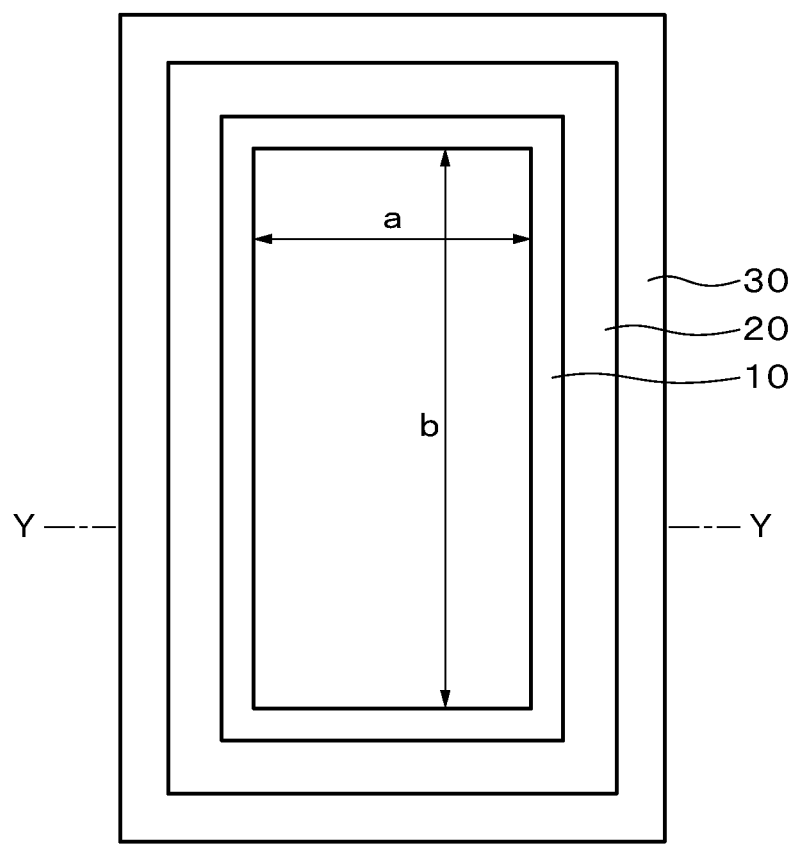
FIG. 13 This is a plan view showing a sputtering cathode assembly in a sputtering device according to the third embodiment of this invention.

FIGS. 12 and 13 are a longitudinal sectional view and a plan view showing a sputtering device according to the third embodiment, and show the configuration in the vicinity of a sputtering cathode assembly provided inside a vacuum vessel of the sputtering device. FIG. 12 is a cross-sectional view along the line Y-Y in FIG. 13.

As shown in FIG. 12 and FIG. 13, in this sputtering device, a plurality of sputtering cathodes are arranged in parallel on a vertical plane, and a sputtering cathode assembly is formed from these sputtering cathodes. The number of sputtering cathodes constituting the sputtering cathode assembly is selected as appropriate, in accordance with the required film forming speed and the like. In FIG. 12 and FIG. 13, only one mutually adjacent pair of sputtering cathodes 1 and 2 is shown, by way of example, but the there is no limitation to this. The spacing between the sputtering cathodes 1 and 2 is selected as appropriate so that a film can be formed by sputtering, not only with the sputtering cathode 1, but also with the sputtering cathode 2, in the space above the sputtering cathode assembly. If three or more sputtering cathodes constitute the sputtering cathode assembly, the spacing between the sputtering cathodes is generally equal, but this does not necessarily have to be equal, and in such cases, the spacing is selected as required. Other aspects of the sputtering device are the same as those of the first embodiment.

[Film Forming Method Using the Sputtering Device]

After the vacuum vessel is evacuated to a high vacuum by a vacuum pump, Ar gas is introduced as a sputtering gas into the space surrounded by the sputtering target 10, and a high DC voltage necessary for plasma generation is generally applied between the anode 40 and the sputtering cathodes from a predetermined power supply. Generally, the anode 40 is grounded and a negative high voltage (for example, −400 V) is applied to the sputtering cathodes. As a result, in the same manner as shown in FIG. 3 and FIG. 4, plasma 60 is generated in the vicinity of the surface of the sputtering target 10, circulating along the inner surface of the sputtering target 10.

Before film formation, the substrate S is located at a position sufficiently far from the top of the space surrounded by the sputtering target 10.

As a result of sputtering of the sputtering target 10 with Ar ions in the plasma 60 circulating along the inner surface of the sputtering target 10 of each sputtering cathode, atoms comprised by the sputtering target 10 are ejected upward from the space surrounded by the sputtering targets 10. At this time, atoms are ejected from all parts of the erosion surface of the sputtering target 10 near the plasma 60, but atoms that are ejected from the erosion surface of the short side portions of the inside of the sputtering target 10 are essentially not used for film formation. Therefore, horizontal shielding plates may be provided above the sputtering target 10 so as to shield both end portions, in the long side direction, of the sputtering target 10, so that atoms ejected from the erosion surfaces of the short-side portions of the sputtering target 10 do not reach the substrate S during film formation. Alternatively, the width b of the sputtering target 10 in the longitudinal direction may be made sufficiently greater than the width of the substrate S, so that atoms ejected from the erosion surface of the short-side portion of the sputtering target 10 do not reach the substrate S during film formation. In the same manner as shown in FIG. 5, as a result of some of the atoms ejected from the sputtering target 10 being shielded by the light blocking shields 50, sputtered particle fluxes 70, 80 are produced from the erosion surface of the long-side portions of the sputtering target 10. The sputtered particle fluxes 70, 80 have substantially uniform intensity distributions in the longitudinal direction of the sputtering target 10.

When stable sputtering particle fluxes 70, 80 are produced from the sputtering cathodes, a film is formed by the sputtered particle fluxes 70, 80, while moving the substrate S with respect to the sputtering targets 10, at a constant speed, in the direction traversing the long-side portions of the sputtering targets 10. When the substrate S moves above the space surrounded by the sputtering target 10, first, the sputtered particle flux 70 is incident on the substrate S, and film formation begins. At the point in time when the leading edge of the substrate S has approached above the vicinity of the center of the space surrounded by the sputtering target 10, the sputtered particle flux 80 does not contribute to film formation. When the substrate S moves further, and the sputtered particle flux 80 is incident thereon, the sputtered particle flux 80 also contributes to film formation, in addition to the sputtered particle flux 70. When the substrate S is moved directly above the space surrounded by the sputtering target 10, the sputtered particle fluxes 70, 80 are incident on the substrate S, whereby film formation is performed. The substrate S is moved further in this manner while film formation is performed. Then, the substrate S is fully distanced from above the space surrounded by the sputtering target 10, moving to a position at which the sputtered particle fluxes 70 and 80 are not incident on the substrate S. A thin film F is formed on the substrate S in this manner.

According to the third embodiment, a plurality of sputtering cathodes having the sputtering target 10 with a rectangular tubular shape having a rectangular cross-section, and having erosion surfaces facing inward are arranged in parallel on a vertical plane, and the polarities of the permanent magnets 20 of two mutually adjacent sputtering cathodes are mutually opposite, whereby the following various advantages can be obtained. That is to say, because sputtering can be performed using a plurality of sputtering cathodes arranged in parallel on a vertical plane, the thin film F can be formed on the substrate S, at a high speed. Furthermore, the plasma 60 can be generated circulating around the inner surface of the sputtering target 10 on the erosion surface side of the sputtering target 10. Therefore, since the density of the plasma 60 can be increased, the film forming speed can be sufficiently increased. Further, since the location at which the majority of the plasma 60 is generated is limited to the vicinity of the surface of the sputtering target 10, in combination with the provision of the light blocking shield 50, the possibility of damage occurring due to the irradiation of the substrate S with light emitted from the plasma 60 can be minimized. Furthermore, the magnetic force lines generated by the magnetic circuit, which is formed by the permanent magnets 20 and the yoke 30, are basically restricted to the sputtering cathode, and moreover, the polarities of the permanent magnets 20 of the two mutually adjacent sputtering cathodes are mutually opposite, and the auxiliary magnetic pole 55 is provided, whereby, among the magnetic force lines generated by the magnetic circuit, the downwardly oriented magnetic force lines are confined to the space in the vicinity of the sputtering cathode assembly, and are not oriented toward the substrate S, as shown in FIG. 12, and there is no risk of the substrate S being damaged by the plasma 60 or electron rays. Furthermore, since the film formation is carried out using the sputtered particle fluxes 70, 80 produced with the pair of mutually facing long-side portions of the sputtering target 10, damage due to bombardment of the substrate S by reflected high energy particles of the neutral sputtering gas can be minimized. Further, because the sputtered particle fluxes 80, 70 produced with the pair of mutually facing long-side portions of the sputtering target 10 have a uniform intensity distribution in a direction parallel to the long-side portions, in combination with performing film formation while moving the substrate S at a constant speed in a direction traversing these long-side portions, for example, in a direction perpendicular to these long-side portions, variations in the film thickness of the thin film F formed on the substrate S can be reduced and, for example, variations in the film thickness can be reduced to ±5% or less. The sputtering device is preferably used in film formation for electrode materials or the like, in the manufacture of various devices such as semiconductor devices, organic solar cells, inorganic solar cells, liquid crystal displays, organic EL displays, films and the like.

Fourth Embodiment

[Sputtering Device]

Figure 14:
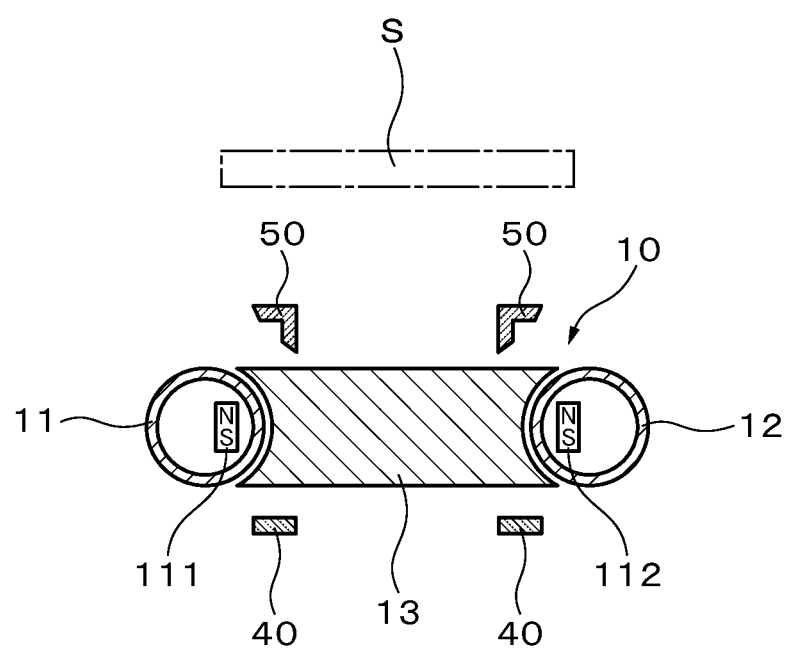
FIG. 14 This is a longitudinal sectional view showing a sputtering device according to a fourth embodiment of this invention.
Figure 15:
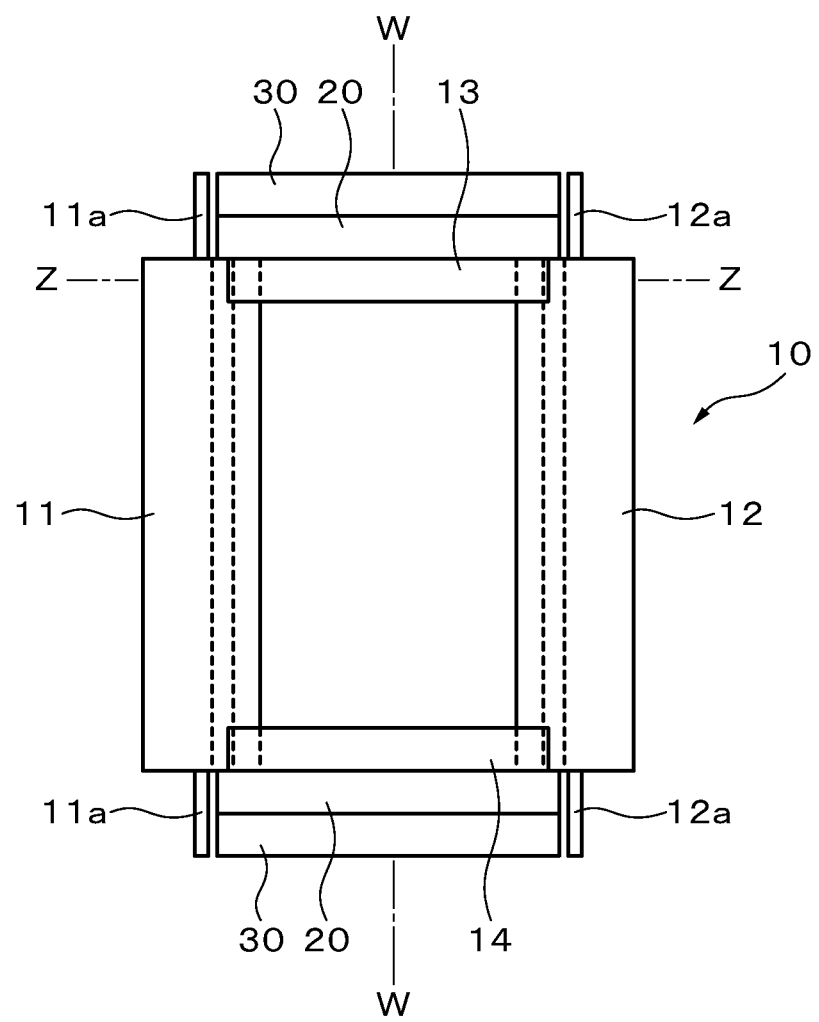
FIG. 15 This is a plan view showing a sputtering cathode in a sputtering device according to the fourth embodiment of this invention.
Figure 16:
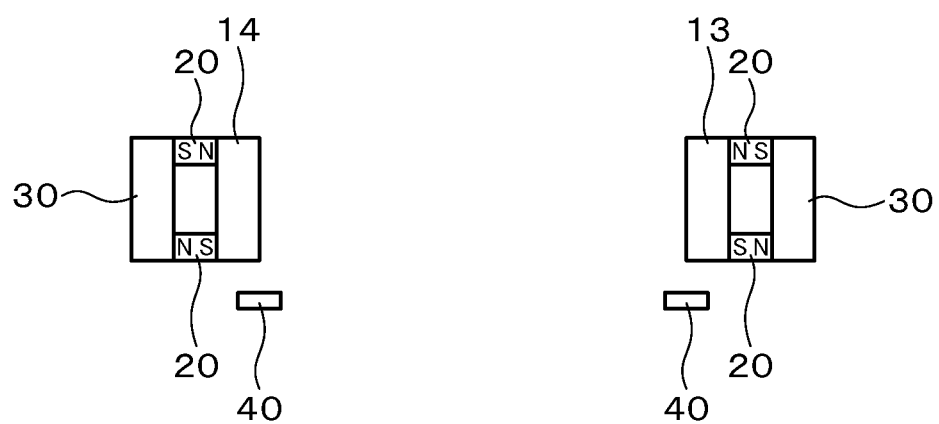
FIG. 16 This is a cross-sectional view along the line W-W in FIG. 15.

FIGS. 14 and 15 are a longitudinal sectional view and a plan view showing a sputtering device according to the fourth embodiment, and show the configuration in the vicinity of a sputtering cathode provided inside a vacuum vessel of the sputtering device. FIG. 14 is a cross-sectional view along the line Z-Z in FIG. 15. FIG. 16 is a cross-sectional view along the line W-W in FIG. 15.

Figure 17:
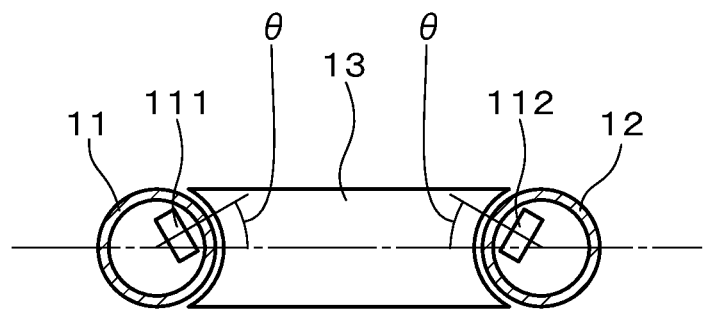
FIG. 17 This is a cross-sectional view serving to describe the angles of inclination of permanent magnets provided within the rotary targets of a sputtering cathode in the sputtering device according to the fourth embodiment of this invention.

As shown in FIGS. 14, 15 and 16, the sputtering device has the sputtering target 10 having a rectangular tubular shape having a rectangular cross-sectional shape (or angular ring shape), and having erosion surfaces facing inward. A pair of mutually facing long-side portions of the sputtering target 10 each comprises cylindrical rotary targets 11, 12, and a pair of mutually facing short-side portions 13, 14 of the sputtering target 10 each have a rectangular cross-sectional shape. The rotary targets 11 and 12 are provided so as to be rotatable about the central axes thereof by a non-illustrated rotation mechanism. Specifically, the rotary targets 11 and 12 are provided with rotary shafts 11a and 12a at both ends thereof, and the rotary targets 11 and 12 are rotated as a result of the rotary shafts 11a and 12a being rotated by the rotation mechanism. The rotational directions of the rotary targets 11 and 12 may be the same as, or opposite to, each other, and are selected as necessary. This is configured so that cooling water can flow through the interior of the rotary cathodes 11, 12 allowing the rotary cathodes 11, 12 to be cooled during use. The short-side portions 13, 14 have heights that are approximately the same as the diameter of the rotary targets 11, 12, for example. Both ends of the short-side portions 13, 14 facing the rotary targets 11, 12 are concavely rounded, corresponding to the cylindrical shape of the rotary targets 11, 12, and are close thereto, to an extent such as does not present a hindrance to the rotation of the rotary targets 11, 12. Permanent magnets 111 and 112 are provided at the interior of the rotary targets 11, 12 at positions parallel to the central axis and radially offset from the central axis. The permanent magnets 111 and 112 have a rectangular cross-sectional shape, the long sides of which are perpendicular to the radial direction of the rotary targets 11 and 12. As shown in FIG. 17, where the angle of inclination of the short sides of the cross-sectional shape of the permanent magnets 111, 112, with respect to the plane including the central axis of the rotary targets 11, 12, is 0, 0 is 0 degrees or more and less than 360 degrees, and the angle of inclination can be set to an any angle within this range so as to achieve a good balance between increased film forming speed and low damage. In FIG. 14, a case in which 0=0 degrees is shown as one example. The permanent magnets 111 and 112 are fixed to a member that is independent of the rotary targets 11 and 12 so that, when the rotary targets 11 and 12 rotate, they do not rotate together therewith. The polarities of the permanent magnets 111 and 112 are as shown in FIG. 14, but may be opposite. The permanent magnets 20 are provided on the outside of the pair of mutually facing short-side portions 13 and 14 of the sputtering target 10, and the yokes 30 are provided on the outside of the permanent magnets 20. The polarities of the permanent magnets 20 are as shown in FIG. 16, but the polarities may also be respectively the exact opposites. The sputtering targets 10, the permanent magnets 20, 111 and 112, and the yokes 30 form a sputtering cathode. The sputtering cathode is generally fixed to the vacuum vessel in an electrically insulated manner. A magnetic circuit is formed by the permanent magnets 111, 112, provided inside the rotary targets 11 and 12, the permanent magnets 20, and the yokes 30. Cooling backing plates are preferably provided between the short-side portions 13, 14 and the permanent magnets 20, and cooling water, for example, flows in flow paths provided inside the backing plates. An anode 40 is provided in the vicinity of the lower end of the space surrounded by the sputtering target 10 so that the erosion surface of the sputtering target 10 is exposed. This anode 40 is generally connected to the grounded vacuum vessel. Furthermore, a light blocking shield 50 having an L-shaped cross-section is provided in the vicinity of the upper end of the space surrounded by the sputtering target 10 so that the erosion surface of the sputtering target 10 is exposed. The light blocking shield 50 is formed from a conductor, and typically from a metal. The light blocking shield 50 also serves as an anode and is generally connected to the grounded vacuum vessel, in the same manner as the anode 40. The other aspects are the same as those of the first embodiment.

[Film Forming Method Using the Sputtering Device]

The film forming method using this sputtering device is the same as that of the first embodiment, except that sputtering is performed while rotating the rotary targets 11, 12 constituting the pair of mutually facing long-side portions of the sputtering target 10.

According to the fourth embodiment, in addition to the advantages similar to those of the first embodiment, the pair of mutually facing long-side portions of the sputtering target 10 comprise the rotary targets 11, 12, which allows for advantages in that the usage efficiency of the sputtering target 10 is high and film formation costs can be reduced.

Fifth Embodiment

[Sputtering Device]

Figure 18:
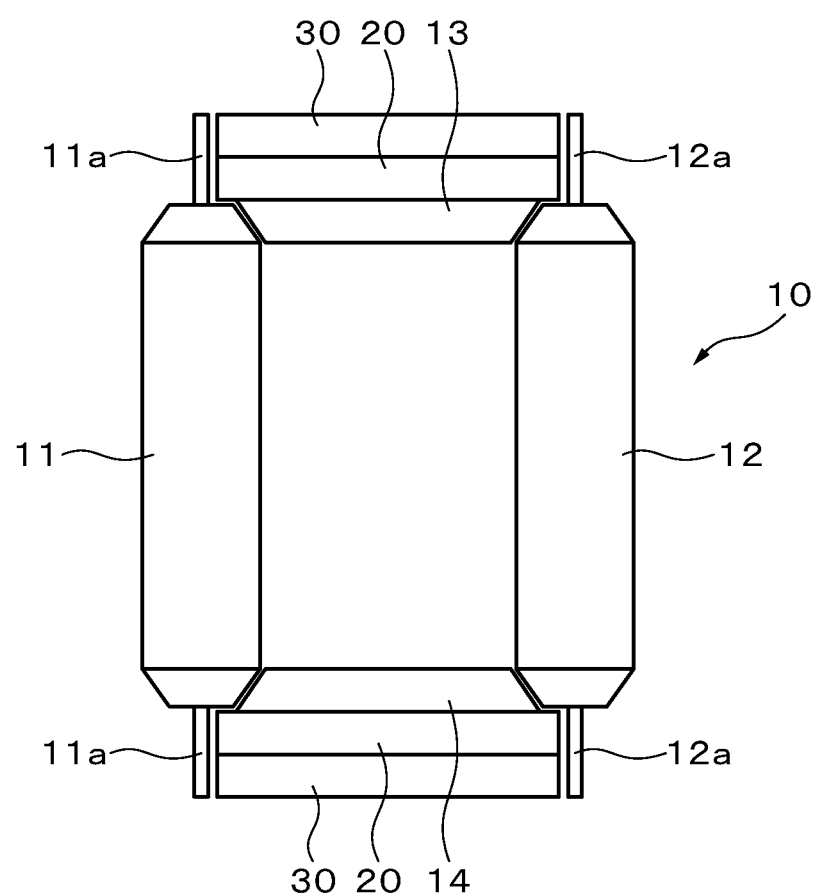
FIG. 18 This is a plan view showing a sputtering cathode in a sputtering device according to a fifth embodiment of this invention.

As shown in FIG. 18, the sputtering device according to the fifth embodiment differs from the fourth embodiment in that both ends of the rotary targets 11, 12 are chamfered (the chamfer angle is, for example, 45 degrees with respect to the central axis of the rotary targets 11, 12), and both ends of the short-side portions 13,14 are also correspondingly chamfered at an angle. The other aspects are the same as those of the fourth embodiment.

[Film Forming Method Using the Sputtering Device]

The film forming method using this sputtering device is the same as that of the fourth embodiment.

Advantages similar to those of the fourth embodiment can be obtained with the fifth embodiment.

Sixth Embodiment

[Sputtering Device]

Figure 19:
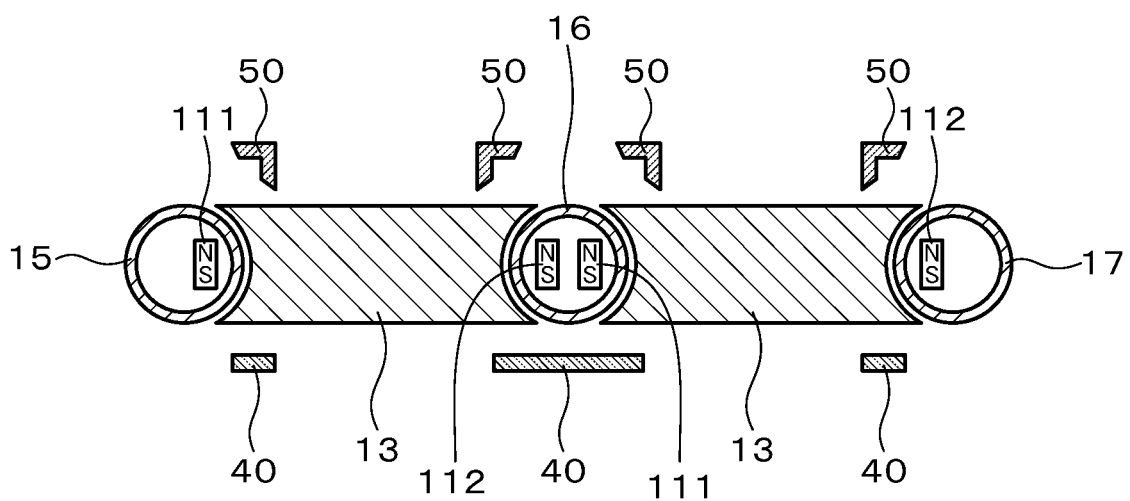
FIG. 19 This is a longitudinal sectional view showing a sputtering device according to a sixth embodiment of this invention.
Figure 20:
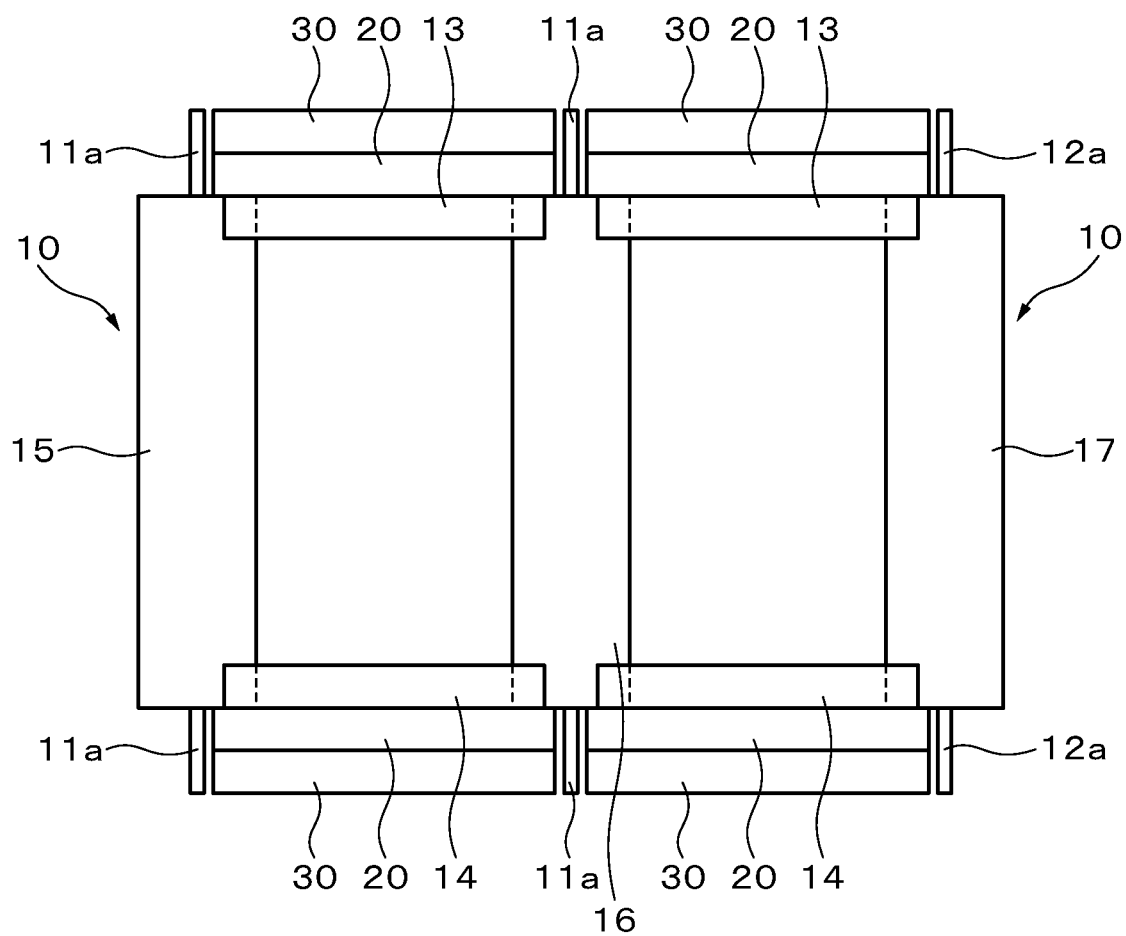
FIG. 20 This is a plan view showing a sputtering cathode in the sputtering device according to the sixth embodiment of this invention.

FIGS. 19 and 20 are a longitudinal sectional view and a plan view showing a sputtering device according to a sixth embodiment, and show the configuration in the vicinity of a sputtering cathode provided inside a vacuum vessel of the sputtering device. FIG. 19 is a cross-sectional view along the line V-V in FIG. 20.

As shown in FIGS. 19 and 20, in this sputtering device, two of the sputtering targets 10 of the sputtering device according to the fourth embodiment are united, with one rotary target being shared, such that the sputtering targets are configured to have three rotary targets 15, 16, 17. The rotational directions of these rotary targets 15, 16, 17 may be the same as, or opposite to, each other, and are selected as necessary. The other aspects are the same as those of the fourth embodiment. Note that four rotary targets may be united, or five or more rotary targets may be united.

[Film Forming Method Using the Sputtering Device]

The film forming method using this sputtering device is the same as that of the fourth embodiment.

According to the sixth embodiment, in addition to the advantages similar to those of the fourth embodiment, advantages are possible in that film formation can be performed efficiently on a substrate S having a large area, and static film formation can also easily be performed. This sixth embodiment is particularly suitable for use in forming an electrode film adjacent to a silicon power generation layer or an organic power generation layer in the manufacture of a device such as a heterojunction silicon solar cell or an organic EL display.

Seventh Embodiment

[Sputtering Device]

Figure 21:
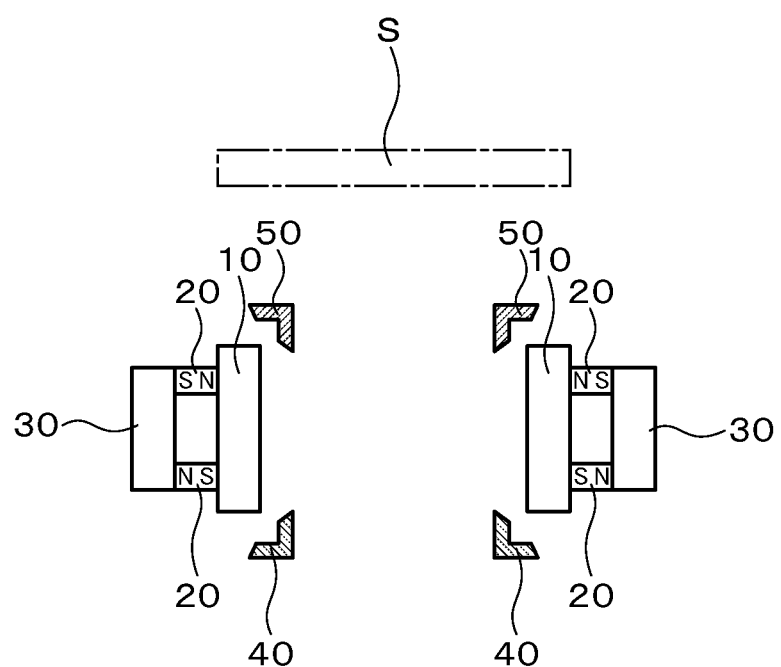
FIG. 21 This is a longitudinal sectional view showing a sputtering device according to a seventh embodiment of this invention.

FIG. 21 is a longitudinal sectional view showing a sputtering device according to a seventh embodiment, and shows the configuration in the vicinity of a sputtering cathode provided inside a vacuum vessel of the sputtering device. Furthermore, FIG. 22 is a perspective view showing the sputtering target 10.

Figure 22:
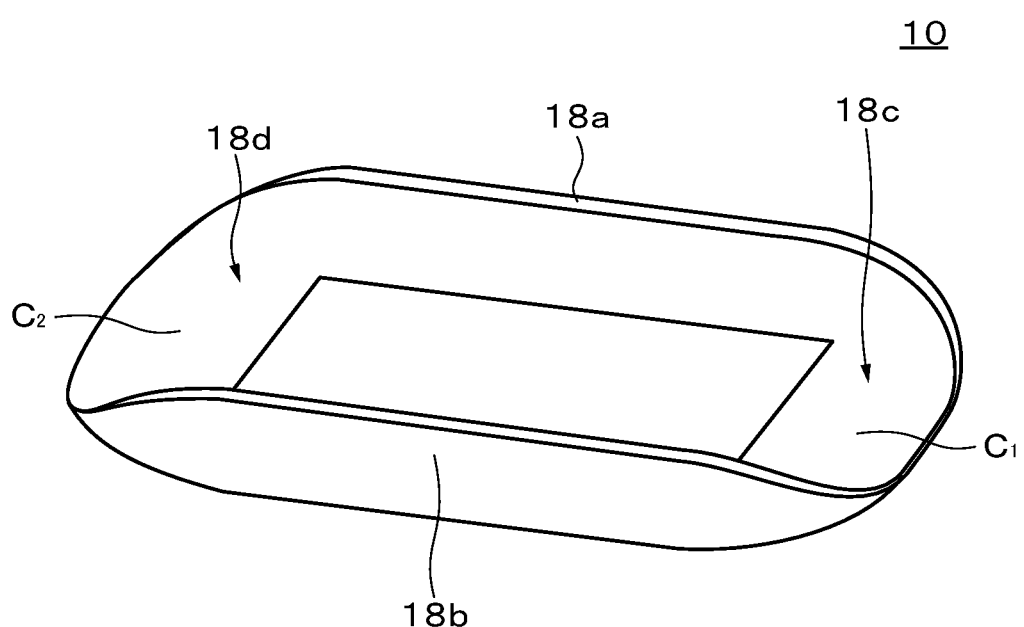
FIG. 22 This is a perspective view showing a sputtering target in a sputtering cathode in the sputtering device according the seventh embodiment of this invention.

As shown in FIGS. 21 and 22, the sputtering device has the sputtering target 10 having a rectangular tubular shape having a rectangular cross-sectional shape (or angular ring shape), and having erosion surfaces facing inward. A permanent magnet assembly 20 is provided on the outside of the sputtering target 10, and a yoke 30 is provided on the outside of the permanent magnet assembly 20. The sputtering target 10, the permanent magnet assembly 20, and the yoke 30 form a sputtering cathode. A pair of mutually facing long-side portions 18*a* and 18*b* of the sputtering target 10 are formed as mutually parallel flat plates. In contrast, a pair of mutually facing short-side portions 18*c* and 18*d* of the sputtering target 10 have shapes which are curved, with respect to a plane or curve including the pair of long-side portions 18*a* and 18*b*, forming a curved surface in which the erosion surface is twisted, from one side of the long-side portions 18*a*, 18*b*, resulting in a shape in central portions C1 and C2 of the short sides 18*c*, 18*d* which is perpendicular to the long-side portions 18*a* and 18*b*, in other words, which lies in a horizontal plane, and further extending to the other side of the long-side portions 18*a*, 18*b*, forming a curved surface in which the erosion surface is twisted. Other aspects are the same as those of the sputtering cathode in the first embodiment.

[Film Forming Method Using the Sputtering Device]

The film forming method using this sputtering device is the same as that of the first embodiment.

According to the seventh embodiment, in addition to advantages similar to those of the first embodiment, since the sputtering target 10 is formed in the shape described above, advantages are possible in that, when film formation is performed with the short-side portions 18*c*, 18*d* arranged in the vertical direction, foreign matter generated during film formation can be prevented from being deposited on the short-side portions 18*c*, 18*d*.

Eighth Embodiment

[Sputtering Device]

In the eighth embodiment, a pulse power source is used as a power source for applying a voltage required for sputtering between the sputtering cathode and the anode, in the sputtering devices according to the first to seventh embodiments. The voltage pulse waveform of this pulse power supply is shown in FIGS. 23A and B. As shown in FIGS. 23A and B, in this pulse power supply, a voltage pulse of 0 V, or a negative voltage V0−, the absolute value of which is about 50 V or less, is applied at a high level, and a negative voltage VL−, the absolute value of which is about 100 V or more, is applied at a low level, so that a positive voltage is not applied. By using a pulse waveform for the voltage applied to the sputtering cathode, some or all of the glow discharge during sputtering can be prevented from becoming an arc discharge.

According to the eighth embodiment, by using a pulse power supply that generates a voltage pulse having the waveform described above, the following advantages are possible. That is to say, according to the findings of the present inventor, if the high level of the voltage pulse is a positive voltage, damage is likely to occur to the substrate S and the thin film F formed on the substrate S, during film formation, as a result of bombarding the substrate S with Ar+ generated from the Ar gas that is used as a sputtering gas, but by not applying a positive voltage, with a high level voltage pulse of 0 V, or a negative voltage $V_0-$, the absolute value of which is about 50 V or less, and a low level voltage pulse of a negative voltage $V_L-$, the absolute value of which is about 100 V or more, such problems can be eliminated, and a high quality thin film F can be formed without damage. The eighth embodiment is particularly suitable for use in forming an electrode film adjacent to an organic film in the manufacture of an organic device such as an organic solar cell or an organic EL display.

Embodiments and examples of this invention have been specifically described above, but this invention is not limited to the aforementioned embodiments and examples, and various modifications are possible based on the technical ideas of this invention.

For example, the numerical values, materials, structures, shapes, and the like given in the aforementioned embodiments and examples are merely examples, and numerical values, materials, structures, shapes, and the like different from these may be used as necessary.

EXPLANATION OF THE SYMBOLS

10, 10*a*, 10*b*, 10*c*, 10*d*: sputtering target; 11, 12, 15 to 17: rotary target; 20, 20*a*, 20*b*, 20*c*, 20*d*: permanent magnet; 30, 30*a*, 30*b*, 30*c*, 30*d*: yoke; 40: anode; 50: light blocking shield; 55: auxiliary magnetic pole; 60: plasma; 70, 80: sputtered particle flux; S: substrate.

I claim:

1. A sputtering cathode assembly, comprising:
a pair of hollow cylindrical sputtering targets arranged parallel to each other and opposing each other across an interior region of the sputtering cathode assembly, with each of the hollow cylindrical sputtering targets being supported for rotation about a longitudinal central axis thereof;
a pair of short-side portions configured as sputtering targets, each of which extends between the pair of hollow cylindrical sputtering targets near respective ends thereof, the pair of short-side portions being arranged co-planar with and perpendicularly to the hollow cylindrical sputtering targets and opposing each other across the interior region of the sputtering cathode assembly, the short-side portions each having a rectangular transverse cross-section at a lengthwise central portion thereof;
a pair of long-side permanent magnets, each of which is disposed within an associated one of the hollow cylindrical sputtering targets, with each of the long-side permanent magnets extending lengthwise within the associated hollow cylindrical sputtering target with a north pole disposed toward one side of the associated hollow cylindrical sputtering target and a south pole disposed toward an opposite side of the associated hollow cylindrical sputtering target;
a pair of short-side permanent magnets associated with and located on an outer-facing side of each of the short-side portions, wherein, for each pair of the short-side permanent magnets, 1) one of the short-side permanent magnets of the pair has a short-side-facing north pole that faces the associated short-side portion and an away-facing south pole that faces away from the associated short-side portion, and 2) the other short-side permanent magnet of the pair has a short-side-facing south pole that faces the associated short-side portion and an away-facing north pole that faces away from the associated short-side portion; and
a magnetically conductive yoke associated with each of the short-side portions, wherein for each of the short-side portions, the associated magnetically conductive yoke extends between the away-facing south pole of said one of the associated short-side permanent magnets and the away-facing north pole of said another of the associated short-side permanent magnets;

wherein
- A) 1) the north poles of the long-side permanent magnets and the short-side-facing north poles of the short-side permanent magnets are all disposed toward a first, upper side of the sputtering cathode assembly; and 2) the south poles of the long-side permanent magnets and the short-side-facing south poles of the short-side permanent magnets are all disposed toward a second, lower side of the sputtering cathode assembly;

or
- B) 1) the south poles of the long-side permanent magnets and the short-side-facing south poles of the short-side permanent magnets are all disposed toward a first, upper side of the sputtering cathode assembly; and 2) the north poles of the long-side permanent magnets and the short-side-facing north poles of the short-side permanent magnets are all disposed toward a second, lower side of the sputtering cathode assembly.

2. The sputtering cathode assembly according to claim 1, wherein the long-side permanent magnets and the hollow cylindrical sputtering targets are supported to rotate independently of each other and about the longitudinal central axes of the hollow cylindrical sputtering targets, whereby an angle of inclination of a surface of each of the long-side permanent magnets is adjustable.

3. The sputtering cathode assembly according to claim 1, further comprising a first anode disposed near the second, lower side thereof.

4. The sputtering cathode assembly according to claim 3, further comprising a light-blocking shield disposed near the first, upper side thereof.

5. The sputtering cathode assembly according to claim 4, wherein the light-blocking shield is formed from a conductor and is electrically connected to the first anode so as to function as a second anode.

* * * * *